United States Patent
Wolfe et al.

(10) Patent No.: US 10,128,808 B2
(45) Date of Patent: Nov. 13, 2018

(54) GAIN CALIBRATION FOR AN IMAGING SYSTEM

(71) Applicant: Seek Thermal, Inc., Santa Barbara, CA (US)

(72) Inventors: Jason Wolfe, Santa Barbara, CA (US); William J. Parrish, Santa Barbara, CA (US); Ross Williams, Santa Barbara, CA (US)

(73) Assignee: Seek Thermal, Inc., Santa Barbara, CA (US)

( * ) Notice: Subject to any disclaimer, the term of this patent is extended or adjusted under 35 U.S.C. 154(b) by 0 days.

(21) Appl. No.: 15/455,007

(22) Filed: Mar. 9, 2017

(65) Prior Publication Data

US 2017/0179912 A1 Jun. 22, 2017

Related U.S. Application Data

(63) Continuation of application No. 14/829,490, filed on Aug. 18, 2015, now Pat. No. 9,595,934.
(Continued)

(51) Int. Cl.
*H03G 3/30* (2006.01)
*G01J 5/22* (2006.01)
(Continued)

(52) U.S. Cl.
CPC .............. *H03G 3/3084* (2013.01); *G01J 1/18* (2013.01); *G01J 1/44* (2013.01); *G01J 5/22* (2013.01);
(Continued)

(58) Field of Classification Search
None
See application file for complete search history.

(56) References Cited

U.S. PATENT DOCUMENTS 5,200,623 A 4/1993 Cannata
6,140,948 A 10/2000 Yu
(Continued)

FOREIGN PATENT DOCUMENTS

EP 1 083 740 3/2001
EP 1 601 185 11/2005
(Continued)

OTHER PUBLICATIONS

PCT International Search Report and Written Opinion for PCT/US2015/032671 dated Sep. 7, 2015 in 16 pages.
(Continued)

*Primary Examiner* — Casey Bryant
(74) *Attorney, Agent, or Firm* — Knobbe Martens Olson & Bear LLP

(57) ABSTRACT

An imaging system includes an array of photodetectors and electronic circuitry associated with the photodetectors to read intensity values from the photodetectors. The electronic circuitry can include an integrator with an integrator capacitor having a nominal capacitance, wherein a gain of the electronic circuitry associated with a photodetector can depend at least in part on the actual capacitance of the integrator capacitor, the actual capacitance differing from the nominal capacitance. The imaging system can be configured to determine a gain factor that depends at least in part on the actual capacitance and/or a signal voltage input to the integrator. The imaging system can be configured to apply the gain factor based at least in part on the actual capacitance of the integrator capacitor calculated. The imaging system can be a thermal imaging system and may include an infrared camera core.

13 Claims, 11 Drawing Sheets

Related U.S. Application Data

(60) Provisional application No. 62/039,579, filed on Aug. 20, 2014.

(51) Int. Cl.

| | | |
|---|---|---|
| *H04N 5/365* | (2011.01) | |
| *H04N 5/33* | (2006.01) | |
| *G01J 1/18* | (2006.01) | |
| *G01J 5/34* | (2006.01) | |
| *G01R 27/26* | (2006.01) | |
| *H01G 7/00* | (2006.01) | |
| *G01J 5/00* | (2006.01) | |
| *G01J 1/44* | (2006.01) | |

(52) U.S. Cl.
CPC ............ *G01J 5/34* (2013.01); *G01R 27/2605* (2013.01); *H01G 7/00* (2013.01); *H04N 5/33* (2013.01); *H04N 5/3651* (2013.01); *H04N 5/3655* (2013.01); *G01J 2001/444* (2013.01); *G01J 2001/4406* (2013.01); *G01J 2005/0048* (2013.01); *G01J 2005/0077* (2013.01)

(56) References Cited

U.S. PATENT DOCUMENTS

| | | |
|---|---|---|
| 6,252,995 B1 | 6/2001 | Takamori |
| 6,730,909 B2 | 5/2004 | Butler |
| 6,757,442 B1 | 6/2004 | Avinash |
| 7,772,557 B2 | 8/2010 | Anderson |
| 7,795,578 B2 | 9/2010 | Högasten et al. |
| 7,796,168 B1 | 9/2010 | Kostrzewa et al. |
| 7,982,652 B2 | 7/2011 | Simony et al. |
| 7,995,859 B2 | 8/2011 | Högasten |
| 8,189,050 B1 | 5/2012 | Hughes et al. |
| 8,208,026 B2 | 6/2012 | Högasten et al. |
| 8,208,755 B1 | 6/2012 | Högasten |
| 8,306,275 B2 | 11/2012 | Högasten |
| 8,340,414 B2 | 12/2012 | Högasten et al. |
| 8,373,757 B1 | 2/2013 | Nguyen |
| 8,378,290 B1 | 2/2013 | Speake et al. |
| 8,428,385 B2 | 4/2013 | Whiteside et al. |
| 8,737,760 B2 | 5/2014 | Olsson et al. |
| 8,780,208 B2 | 7/2014 | Högasten et al. |
| 9,332,186 B2 | 5/2016 | Johansson et al. |
| 9,335,352 B2 | 5/2016 | McCrea et al. |
| 2002/0022938 A1 | 2/2002 | Butler |
| 2002/0074499 A1 | 6/2002 | Butler |
| 2002/0146345 A1 | 10/2002 | Neilson |
| 2004/0012676 A1 | 1/2004 | Weiner |
| 2005/0099504 A1 | 5/2005 | Nayar |
| 2005/0179468 A1 | 8/2005 | Zhou |
| 2006/0092297 A1 | 5/2006 | Lee et al. |
| 2006/0139198 A1 | 6/2006 | Rao et al. |
| 2006/0193509 A1 | 8/2006 | Criminisi |
| 2007/0147698 A1 | 6/2007 | Reid |
| 2009/0073278 A1 | 3/2009 | Ogawa et al. |
| 2009/0273675 A1 | 11/2009 | Jonsson |
| 2010/0039306 A1 | 2/2010 | Simony et al. |
| 2010/0141768 A1 | 6/2010 | Liberman et al. |
| 2010/0238294 A1 | 9/2010 | Högasten et al. |
| 2011/0141368 A1 | 6/2011 | Wallace et al. |
| 2013/0064449 A1 | 3/2013 | Menikoff |
| 2013/0077888 A1 | 3/2013 | Meyers et al. |
| 2013/0147966 A1 | 6/2013 | Kostrzewa et al. |
| 2013/0169819 A1 | 7/2013 | Strandemar |
| 2013/0222604 A1 | 8/2013 | Ingerhed et al. |
| 2013/0242125 A1 | 9/2013 | Yang et al. |
| 2013/0250125 A1 | 9/2013 | Garrow et al. |
| 2013/0258131 A1 | 10/2013 | Hashimoto et al. |
| 2013/0268212 A1 | 10/2013 | Makarov et al. |
| 2013/0300875 A1 | 11/2013 | Strandemar et al. |
| 2014/0015921 A1 | 1/2014 | Foi et al. |
| 2014/0016879 A1 | 1/2014 | Högasten et al. |
| 2014/0037225 A1 | 2/2014 | Högasten et al. |
| 2014/0078360 A1 | 3/2014 | Park et al. |
| 2014/0092257 A1 | 4/2014 | Högasten et al. |
| 2014/0092258 A1 | 4/2014 | Dart et al. |
| 2014/0168445 A1 | 6/2014 | Högasten et al. |
| 2014/0247365 A1 | 9/2014 | Gardner et al. |
| 2014/0313343 A1 | 10/2014 | Frank et al. |
| 2014/0313385 A1 | 10/2014 | Sato et al. |
| 2014/0355902 A1 | 12/2014 | Olsson |
| 2014/0355904 A1 | 12/2014 | Olsson |
| 2015/0146009 A1 | 5/2015 | Kostrzewa et al. |
| 2015/0187144 A1 | 7/2015 | Roth |
| 2015/0310594 A1 | 10/2015 | Olsson |
| 2015/0312488 A1 | 10/2015 | Kostrzewa et al. |
| 2015/0312489 A1 | 10/2015 | Hoelter et al. |
| 2015/0316473 A1 | 11/2015 | Kester et al. |
| 2015/0319379 A1 | 11/2015 | Nussmeier et al. |
| 2015/0350567 A1 | 12/2015 | Parrish et al. |
| 2016/0041039 A1 | 2/2016 | Olsson |
| 2016/0042500 A1 | 2/2016 | Engberg et al. |
| 2016/0044306 A1 | 2/2016 | Chahine et al. |
| 2016/0056785 A1 | 2/2016 | Wolfe et al. |
| 2016/0057369 A1 | 2/2016 | Wolfe et al. |
| 2016/0061883 A1 | 3/2016 | Engberg et al. |
| 2016/0156858 A1 | 6/2016 | Lee et al. |
| 2016/0198102 A1 | 7/2016 | Chahine et al. |
| 2016/0202117 A1 | 7/2016 | Hosking |
| 2016/0203694 A1 | 7/2016 | Högasten et al. |
| 2016/0323525 A1 | 11/2016 | Lee |

FOREIGN PATENT DOCUMENTS

| | | |
|---|---|---|
| EP | 1667 066 | 6/2006 |
| EP | 2 157 699 | 2/2010 |
| EP | 2 618 560 | 7/2013 |
| EP | 2 645 577 | 10/2013 |
| WO | WO 2013/084809 | 6/2013 |
| WO | WO 2013/191611 | 12/2013 |
| WO | WO 2014/106210 | 7/2014 |

OTHER PUBLICATIONS

PCT International Search Report and Written Opinion for PCT/US042826 dated Oct. 16, 2015 in 12 pages.
PCT International Search Report and Written Opinion for PCT/US043547 dated Oct. 9, 2015 in 11 pages.
PCT International Search Report and Written Opinion for PCT/US045656 dated Oct. 21, 2015 in 12 pages.
Badamchizadeh, et al., Image and Graphics, Comparative Study of Unsharp Masking Methods for Image Enhancement, 2004, pp. 27-30.
PCT International Search Report and Written Opinion for PCT/US2015/063111 dated May 17, 2016 in 13 pages.
Dynamic-range compression and contrast enhancement in infrared imaging systems.
"The Integrator Amplifier," Electronics Tutorials, http://www.electronics-tutorials.ws/opamp/opamp_6.html, accessed Sep. 22, 2016.
Viarini, N et al, "A 16-Cell 80dB Dynamic-Range Auto-Ranging Read-Out Array for Uncooled IR Micro-Bolometers," Solid-State Sensors, Actuators and Microsystems Conference, 2007. Transducers 2007. International, IEEE, Piscataway, NJ, Jun. 10, 2007.
Provost, Benoit et al., "On-Chip Ramp Generators for Mixed-Signal BIST and ADC Self-Test," 2003, IEEE Journal of Solid-State Circuits, 38 (2), pp. 263-273.

Gain ~ $Z_C/R_3$ ~ $(t_{int}/C)/R_3$ ~ $1/C$

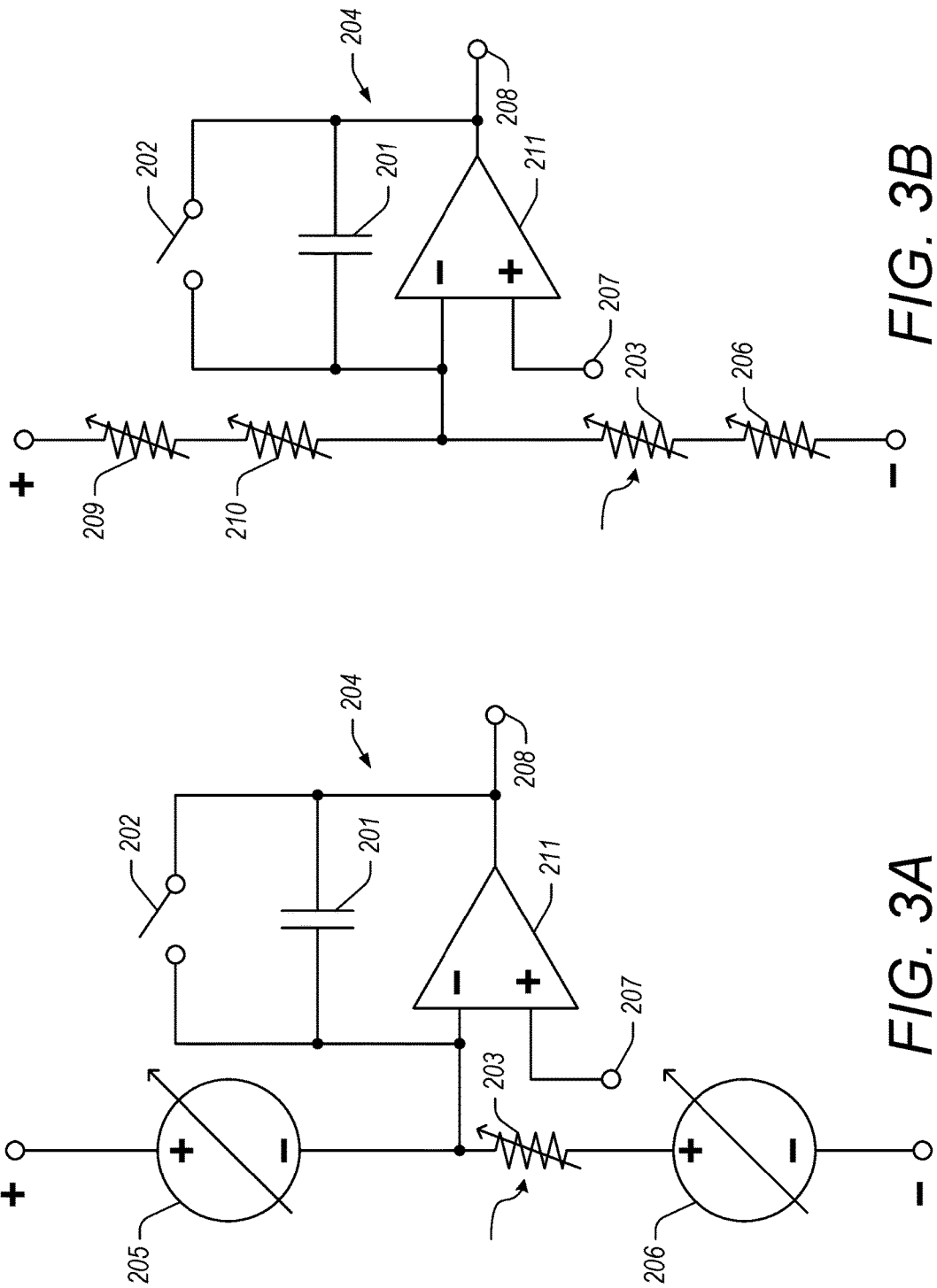

GAIN CALIBRATION FOR AN IMAGING SYSTEM

CROSS-REFERENCE TO RELATED APPLICATIONS

This application is a continuation of U.S. patent application Ser. No. 14/829,490, filed Aug. 18, 2015, entitled "GAIN CALIBRATION FOR AN IMAGING SYSTEM," which claims the benefit of priority from U.S. Prov. App'n No. 62/039,579, filed Aug. 20, 2014, entitled "GAIN CALIBRATION FOR AN IMAGING SYSTEM," which are incorporated by reference herein in their entirety.

BACKGROUND

Field

The present disclosure generally relates to gain calibration for imaging systems, such as cameras including infrared cameras for thermal imaging systems, and in particular to systems and methods for determining gain characteristics due to changes in capacitance as a function of signal.

Description of Related Art

The increasing availability of high-performance, low-cost uncooled infrared imaging devices, such as bolometer focal plane arrays (FPAs), is enabling the design and production of mass-produced, consumer-oriented infrared (IR) cameras capable of quality thermal imaging. Such thermal imaging sensors have long been expensive and difficult to produce, thus limiting the employment of high-performance, long-wave imaging to high-value instruments, such as aerospace, military, or large-scale commercial applications. Mass-produced IR cameras may have different design requirements than complex military or industrial systems. New approaches for accounting for gain linearity, for example, may be desirable for low-cost, mass-produced systems.

SUMMARY

Example embodiments described herein have innovative features, no single one of which is indispensable or solely responsible for their desirable attributes. Without limiting the scope of the claims, some of the advantageous features will now be summarized.

An imaging system includes an array of photodetectors and electronic circuitry associated with the photodetectors to read intensity values from the photodetectors. The electronic circuitry can include an integrator with an integrator capacitor having a nominal capacitance, wherein a gain of the electronic circuitry associated with a photodetector can depend at least in part on the actual capacitance of the integrator capacitor, the actual capacitance differing from the nominal capacitance. The imaging system can be configured to determine a gain factor that depends at least in part on the actual capacitance and/or a signal voltage input to the integrator. The imaging system can be configured to apply the gain factor based at least in part on the actual capacitance of the integrator capacitor calculated. The imaging system can be a thermal imaging system and may include an infrared camera core.

In a first aspect, a method is disclosed for gain calibration of an imaging system. The imaging system includes an array of photodetectors and detector electronic circuitry for reading out image data from the array of photodetectors, wherein the detector electronic circuitry includes an integrator with an integrator capacitor having a nominal capacitance, and a gain of the detector electronic circuitry is a function of integrator capacitance. The method includes measuring a capacitance of the integrator capacitor as a function of a signal voltage across the capacitor. The method also includes determining a mathematical relationship between signal voltage, measured capacitance, and measured gain. The method also includes modifying, for individual photodetectors, a gain value used by the imaging system using the determined mathematical relationship, wherein the gain value is an output of the mathematical relationship and the signal voltage is an input to the mathematical relationship.

In some embodiments of the first aspect, determining includes varying the input current to the integrator over a plurality of known values, integrating at the plurality of known input current, observing the signal voltage produced by integration, comparing the actual signal voltage to that expected with nominal integration capacitance, and calculating the actual integration capacitance as a function of signal voltage. In some embodiments of the first aspect, developing further comprises fitting a curve to the measured capacitance as a function of signal voltage. In a further embodiment, the method also includes developing a mathematical function that maps an input signal voltage to an output actual gain from the mathematical relationship, or developing a look up table from the mathematical relationship that indexes actual gain to signal voltage.

In some embodiments of the first aspect, the gain calibration is performed for one or more pixels of an individual FPA of an FPA design, and the mathematical relationship is applied for each pixel of individual FPAs of the FPA design. In some embodiments of the first aspect, the gain calibration is performed for one or more pixels of an individual FPA, and the mathematical relationship is applied for individual pixels of the individual FPA. In some embodiments of the first aspect, the gain calibration is performed for individual pixels of an individual FPA, a mathematical relationship being determined for the individual pixels, and the mathematical relationships are used for the individual pixels of the individual FPA.

In some embodiments of the first aspect, the detector electronic circuitry includes a test current source and the method further includes switching in place of a photodetector the test current source to produce the plurality of input current or voltage values. In a further embodiment, the detector electronic circuitry includes variable resistor values, and the method further comprises varying the variable resistor values. In some embodiments of the first aspect, the method includes determining the gain calibration for a plurality of integration times.

In some embodiments of the first aspect, the signal voltage ranges from a negative value to a positive value. In some embodiments of the first aspect, the signal voltage is within a range where a measured capacitance of the integrator capacitor deviates significantly from the nominal capacitance of the integrator capacitance. In some embodiments of the first aspect, the modified gain value is updated on a substantially continuous basis during operation of the imaging system.

In some embodiments of the first aspect, the imaging system comprises a thermal imaging system including an infrared camera core.

In a second aspect, an imaging system includes an imaging array comprising an infrared focal plane array, the infrared focal plane array comprising an array of microbolometers, each pixel of the focal plane array including a microbolometer photodetector. The imaging system includes a detector circuit with a positive voltage rail; a negative voltage rail; at least one variable resistor network; and an integrator comprising a signal input electrically coupled to an output of a microbolometer and an input of an operational amplifier, an integrator capacitor having a nominal capacitance, a reference input electrically coupled to an integrator bias voltage source and the operational amplifier, a signal output from the operational amplifier, and an integrator switch configured to provide an electrical path from the signal input to the signal output when the integrator switch is closed. The imaging system includes a system controller configured to adjust the variable resistor network to set an operating bias of the detector circuit and to control the integrator switch to control an integration time for a signal from the microbolometer. An individual microbolometer is electrically coupled to the positive voltage rail, the negative voltage rail, the at least one variable resistor network, and the integrator. The system controller is configured to determine an actual capacitance of the integrator capacitor by determining a mathematical relationship between a plurality of measured capacitances and corresponding signal voltages.

In some embodiments of the second aspect, the detector circuit further comprises a test current source configured to be switched in place of an individual microbolometer, wherein the system controller is configured to switch the test current source to provide input to the integrator using a plurality of input currents. In some embodiments of the second aspect, the system controller is further configured to measure signal voltages using a plurality of integration times by controlling an amount of time the integrator switch is closed. In some embodiments of the second aspect, the system controller is further configured to modify a gain value for an individual microbolometer using the mathematical relationship and a measured signal voltage.

In some embodiments of the second aspect, the signal voltages range from a negative value to a positive value. In some embodiments of the second aspect, the signal voltages are within a range where a measured capacitance of the integrator capacitor deviates significantly from the nominal capacitance of the integrator capacitance.

BRIEF DESCRIPTION OF THE DRAWINGS

Aspects and advantages of the embodiments provided herein are described with reference to the following detailed description in conjunction with the accompanying drawings. Throughout the drawings, reference numbers may be re-used to indicate correspondence between referenced elements. The drawings are provided to illustrate example embodiments described herein and are not intended to limit the scope of the disclosure.

FIGS. 3A-3C illustrate electrical schematic diagrams of example circuits for photodetectors in an imaging system.

DETAILED DESCRIPTION

Figure 1A:
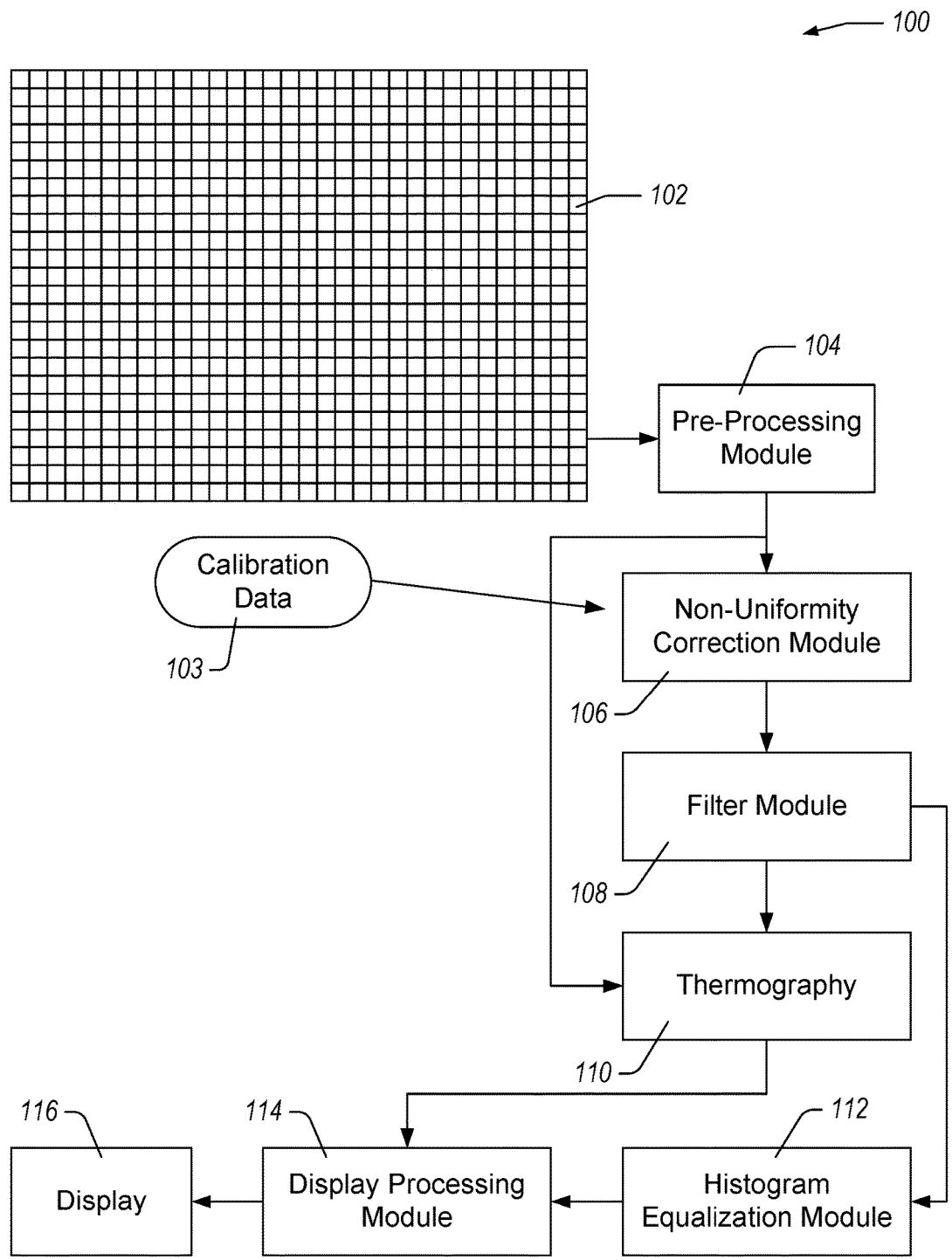
FIG. 1A illustrates a functional block diagram of an example imaging system.

Generally described, aspects of the present disclosure relate to gain calibration of an imaging system. The gain calibration can be configured to account for behavior of an integrator in a photodetector circuit, a capacitance of an integrator capacitor of the integrator differing from a nominal capacitance as a function of signal input to the integrator. The present disclosure includes systems and methods to determine gain factors to account for the actual capacitance across the integrator capacitor rather than relying on the nominal capacitance. To determine these gain factors, the systems and methods disclosed herein determine the actual capacitance of the integrator capacitor as a function of a signal voltage at the integrator and relate that value to the actual gain of the integrator. The systems and methods use these gain factors to modify gain values as a function of signal voltage to account for the actual behavior of the integrator capacitor. Thus, in some embodiments, these systems and methods can determine appropriate gain values over a relatively wide range of signal voltages, compensating for deviations from nominal behavior in photodetector circuitry. Advantageously, this can allow the imaging system to account for voltage dependence of integrator capacitance.

Although examples and implementations described herein focus, for the purpose of illustration, on implementation in an infrared camera core using a focal plane array with microbolometers, the systems and methods disclosed herein can be implemented in digital and/or video cameras that acquire visible light using a variety of image sensors. Various aspects of the disclosure will now be described with regard to certain examples and embodiments, which are intended to illustrate but not limit the disclosure.

Some embodiments described herein provide gain calibration for imaging systems where an integrator capacitor has a capacitance that depends at least in part on voltage across the capacitor. The dependence can be characterized using curve fits and/or look-up tables, for example. This can advantageously allow an imaging system to modify gain values for photodetectors to account for the actual capacitance of the integrator capacitor.

Some embodiments described herein provide for gain calibration for imaging systems where capacitance changes as a function of voltage across a capacitor. This may be particularly beneficial where the capacitors are metal-oxide-semiconductor structures, or otherwise produced by a microlithographic process, as part of a read out integrated circuit (ROTC). Capacitors thus configured may exhibit a dependence on voltage across the capacitor that is stronger than a similar dependence for capacitors manufactured using physical structures to provide the capacitance (e.g., ceramic capacitors, film capacitors, etc.). Thus, the disclosed systems and methods may be beneficial for use with read out integrated circuits using capacitors formed by a microlithographic process.

Some embodiments described herein may provide for read out integrated circuit design with beneficial capacitor discharge characteristics. For example, read out integrated circuits can be implemented with photodetectors wherein an output signal can range from negative to positive values. Due at least in part to the signal voltage range ranging from negative to positive values, the magnitude of signals across an integrator capacitor can be small relative to a similar read out integrated circuit designed for signals that are greater than 0. This can increase the speed of the read out electronic circuitry.

The disclosed methods for gain calibration may be implemented as modules that may be a programmed computer method or a digital logic method and may be implemented using a combination of any of a variety of analog and/or digital discrete circuit components (transistors, resistors, capacitors, inductors, diodes, etc.), programmable logic, microprocessors, microcontrollers, application-specific integrated circuits, or other circuit elements. A memory configured to store computer programs or computer-executable instructions may be implemented along with discrete circuit components to carry out one or more of the methods described herein. In certain implementations, the disclosed methods may be implemented in conjunction with a focal plane array (FPA) on a camera core, wherein the processor and memory components executing the disclosed methods may be on a device mated to the camera core, such as a mobile appliance including smart phones, tablets, personal computers, etc. In some implementations, the processing and memory elements of the imaging system may be in programmable logic or on-board processors that are part of the core or camera system. In some embodiments, image gain calibration may be accomplished on a processing element on the camera core, and further image processing and display may be accomplished by a system controller mated to the core.

As a particular example of some advantages provided by the disclosed systems and methods, an imaging system can include a focal plane array (FPA) configured to acquire images of a scene. The FPA can include a two-dimensional array of N detectors, the FPA configured to output a two-dimensional image of the scene. For imaging purposes, image frames, typically data from all or some of the detectors $N_f$, are produced by the FPA, each successive frame containing data from the array captured in successive time windows. Thus, a frame of data delivered by the FPA comprises $N_f$ digital words, each word representing a particular pixel, P, in the image. These digital words are usually of a length determined by the analog to digital conversion (A/D) process. For example, if the pixel data is converted with a 14 bit A/D, the pixel words may be 14 bits in length, and there may be 16384 counts per word. For an IR camera used as a thermal imaging system, these words may correspond to an intensity of radiation measured by each pixel in the array. In a particular example, for a bolometer IR FPA the intensity per pixel usually corresponds to temperature of the corresponding part of the imaged scene, with lower values corresponding to colder regions and higher values to hotter regions. It may be desirable to display this data on a visual display.

Each pixel in an FPA may include a radiation detector that generates relatively small signals in response to detected radiation, such as in an infrared imaging array. These signals may be relatively small compared to signals or signal levels in the FPA arising from sources not caused by incident radiation, or non-image signals, wherein these non-image signals are related to the materials, structure, and/or components of the FPA. For example, pixels in an FPA can include interface circuitry including resistor networks, transistors, and capacitors on a read out integrated circuit (ROIC) that may be directly interfaced to the array of detectors. For instance, a microbolometer detector array, a microelectrical mechanical system (MEMS) device, may be manufactured using a MEMS process. The associated ROIC, however, may be fabricated using electronic circuit techniques. These two components can be combined together to form the FPA. The combination of the interface circuitry and the detector itself may have offset and temperature behaviors that are relatively large compared to the signals produced in response to incident radiation on the detectors. Thus, it is often desirable to compensate for these effects that are not related to the image signal before displaying or otherwise processing the image data.

Example Imaging Systems

FIG. 1A illustrates a functional block diagram of an imaging system 100 comprising an image sensor such as a focal plane array 102, a pre-processing module 104, a non-uniformity correction module 106, a filter module 108, a thermography module 110, a histogram equalization module 112, a display processing module 114, and a display 116. The focal plane array 102 can output a sequence of frames of intensity data (e.g., images, thermal images, etc.). Each frame can include an array of pixel values, each pixel value representing light intensity detected by a corresponding pixel on the focal plane array 102. The pixel values can be read out of the focal plane array 102 as a stream of serial digital data. In some embodiments, the pixel values are read out of the focal plane array 102 using read out electronics that process whole rows or whole columns of the focal plane array 102. The format of the stream of data can be configured to conform to a desired, standard, or pre-defined format. The stream of digital data can be displayed as a two-dimensional image, such as by the display 116.

In some embodiments, the focal plane array 102 can be an array of microbolometers integrated with a read out integrated circuit ("ROIC"). The array of microbolometers can be configured to generate electrical signals in response to a quantity of thermal radiation or a temperature. The ROIC can include buffers, integrators, analog-to-digital converters, timing components, and the like to read the electrical signals from the array of microbolometers and to output a digital signal (e.g., 14-bit serial data separated into image frames). Additional examples of systems and methods associated with the focal plane array 102 are disclosed in U.S. patent application Ser. No. 14/292,124, entitled "Data Digitization and Display for an Imaging System," filed May 30, 2014, the entire contents of which is incorporated by reference herein.

The focal plane array 102 can have calibration or other monitoring information associated with it (e.g., calibration data 103) that can be used during image processing to generate a superior image. For example, calibration data 103 may include bad pixel maps and/or gain tables stored in data storage and retrieved by modules in the imaging system 100 to correct and/or adjust the pixel values provided by the focal plane array 102. Calibration data 103 may include gain tables. As described herein, the focal plane array 102 can include a plurality of pixels with integrated read out electronics. The read out electronics can have a gain associated with it, wherein the gain may be proportional to the transimpedance of a capacitor in the electronics. This gain value, which may in some implementations take the form of a pixel gain table, may be used by the image processing modules of the imaging system 100. Additional examples of calibration data for the imaging system 100 are described in greater detail herein with reference to FIGS. 2-11. The calibration data 103 can be stored on the imaging system 100 or in data storage on another system for retrieval during image processing.

The imaging system 100 includes one or more modules configured to process image data from the focal plane array 102. One or more of the modules of the imaging system 100 can be eliminated without departing from the scope of the disclosed embodiments. The following modules are described to illustrate the breadth of functionality available to the disclosed imaging systems and not to indicate that any individual module or described functionality is required, critical, essential, or necessary.

The imaging system 100 includes the pre-processing module 104. The pre-processing module 104 can be configured to receive the digital data stream from the focal plane array 102 and to perform pre-processing functions. Examples of such functions include frame averaging, high-level frame-wide filtering, etc. The pre-processing module 104 can output serial digital data for other modules.

As an example, the pre-processing module 104 can include conditional summation functionality configured to implement integration and averaging techniques to increase apparent signal to noise in image data. For example, the conditional summation functionality can be configured to combine successive frames of digitized image data to form a digitally integrated image. This digitally integrated image can also be averaged to reduce noise in the image data. The conditional summation functionality can be configured to sum values from successive frames for each pixel from the focal plane array 102. For example, the conditional summation functionality can sum the values of each pixel from four successive frames and then average that value. In some implementations, the conditional summation functionality can be configured to select a best or preferred frame from successive frames rather than summing the successive frames. Examples of these techniques and additional embodiments are disclosed in U.S. patent application Ser. No. 14/292,124, entitled "Data Digitization and Display for an Imaging System," filed May 30, 2014, the entire contents of which is incorporated by reference herein.

As another example, the pre-processing module 104 can include adaptive resistor digital to analog converter ("RDAC") functionality configured to determine and/or adjust for operating bias points of the focal plane array 102. For example, for an imaging system that includes a shutter, the imaging system 100 can be configured to adjust an operating bias point of the detectors in the focal plane array 102. The adaptive RDAC functionality can implement an adaptive operating bias correction method that is based at least in part on periodic measurement of a flat field image (e.g., an image acquired with the shutter closed). The adaptive RDAC functionality can implement an ongoing adjustment of the operating bias based at least in part on a measured or detected drift over time of the flat field image. The bias adjustment provided by the adaptive RDAC functionality may provide compensation for drift over time of the photodetectors and electronics due to effects such as temperature changes. In some embodiments, the adaptive RDAC functionality includes an RDAC network that can be adjusted to bring measured flat field data closer to a reference bias level. Additional examples of systems and methods related to the adaptive RDAC functionality are described in greater detail in U.S. Prov. Pat. App'n No. 62/039,566, filed Aug. 20, 2014, entitled "Adaptive Adjustment of the Operating Bias of an Imaging System," the entire contents of which is incorporated by reference herein.

After the pre-processing module 104, other processing modules can be configured to perform a series of pixel-by-pixel or pixel group processing steps. For example, the image processing system 100 includes a non-uniformity correction module 106 configured to adjust pixel data for gain and offset effects that are not part of the image scene itself, but are artifacts of the sensor. For example, the non-uniformity correction module 106 can be configured to receive a stream of digital data and correct pixel values for non-uniformities in the focal plane array 102. In some imaging systems, these corrections may be derived by intermittently closing a shutter over the focal plane array 102 to acquire uniform scene data. From this acquired uniform scene data, the non-uniformity correction module 106 can be configured to determine deviations from uniformity. The non-uniformity correction module 106 can be configured to adjust pixel data based on these determined deviations. In some imaging systems, the non-uniformity correction module 106 utilizes other techniques to determine deviations from uniformity in the focal plane array. Some of these techniques can be implemented without the use of a shutter. Additional examples of systems and methods for non-uniformity correction are described in U.S. patent application Ser. No. 14/817,847, entitled "Time Based Offset Correction for Imaging Systems," filed Aug. 4, 2015, the entire contents of which is incorporated by reference herein.

After the pre-processing module 104, the imaging system 100 can include a high/low $C_{int}$ signal processing functionality configured to receive a stream of digital data (e.g., 14-bit serial data) from the pre-processing module 104. The high/low $C_{int}$ functionality can be configured to process the stream of digital data by applying gain tables, for example, as provided in the calibration data 103. The high/low $C_{int}$ functionality can be configured to process the stream of digital data using output of high/low integration components. Such high/low integration components can be integrated with the ROIC associated with the focal plane array 102. Examples of the high/low integration components are described in U.S. patent application Ser. No. 14/292,124, entitled "Data Digitization and Display for an Imaging System," filed May 30, 2014, the entire contents of which is incorporated by reference herein.

The image processing system 100 includes a filter module 108 configured to apply one or more temporal and/or spatial filters to address other image quality issues. For example, the read out integrated circuit of the focal plane array can introduce artifacts into an image, such as variations between rows and/or columns. The filter module 108 can be configured to correct for these row- or column-based artifacts, as described in greater detail in U.S. patent application Ser. No. 14/702,548, entitled "Compact Row Column Noise Filter for an Imaging System," filed May 1, 2015, the entire contents of which is incorporated by reference herein. The filter module 108 can be configured to perform corrections to reduce or eliminate effects of bad pixels in the image, enhance edges in the image data, suppress edges in the image data, adjust gradients, suppress peaks in the image data, and the like.

For example, the filter module 108 can include bad pixel functionality configured to provide a map of pixels on the focal plane array 102 that do not generate reliable data. These pixels may be ignored or discarded. In some embodiments, data from bad pixels is discarded and replaced with data derived from neighboring, adjacent, and/or near pixels. The derived data can be based on interpolation, smoothing, averaging, or the like.

As another example, the filter module 108 can include thermal gradient functionality configured to adjust pixel values based on thermal gradients present in the image data but that are not part of the scene imaged by the imaging system 100. The thermal gradient functionality can be configured to use local flat scene data to derive data to improve image quality by correcting for thermal gradients produced in the imaging system 100. Examples of determining corrections for the thermal gradient functionality are described in greater detail in U.S. Prov. App'n No. 62/086,305, entitled "Image Adjustment Based on Locally Flat Scenes," filed Dec. 2, 2014, the entire contents of which is incorporated by reference herein.

The filter module 108 can include peak limit functionality configured to adjust outlier pixel values. For example, the peak limit functionality can be configured to clamp outlier pixel values to a threshold value.

The filter module 108 can be configured to include an adaptive low-pass filter and/or a high-pass filter. In some embodiments, the imaging system 100 applies either the adaptive low-pass filter or the high-pass filter, but not both. The adaptive low-pass filter can be configured to determine locations within the pixel data where it is likely that the pixels are not part of an edge-type image component. In these locations, the adaptive low-pass filter can be configured to replace pixel data with smoothed pixel data (e.g., replacing pixel values with the average or median of neighbor pixels). This can effectively reduce noise in such locations in the image. The high-pass filter can be configured to enhance edges by producing an edge enhancement factor that may be used to selectively boost or diminish pixel data for the purpose of edge enhancement. Additional examples of adaptive low-pass filters and high-pass filters are described in U.S. patent application Ser. No. 14/817,989, entitled "Local Contrast Adjustment for Digital Images," filed Aug. 4, 2015, the entire contents of which is incorporated by reference herein.

The filter module 108 can be configured to apply optional filters to the image data. For example, optional filters can include, without limitation, averaging filters, median filters, smoothing filters, and the like. The optional filters can be turned on or off to provide targeted or desired effects on the image data.

The image processing system 100 includes a thermography module 110 configured to convert intensity to temperature. The light intensity can correspond to intensity of light from a scene and/or from objects in a field of view of the imaging system 100. The thermography module 110 can be configured to convert the measured light intensities to temperatures corresponding to the scene and/or objects in the field of view of the imaging system 100. The thermography module 110 can receive as input calibration data (e.g., calibration data 103). The thermography module 110 may also use as inputs raw image data (e.g., pixel data from the pre-processing module 104) and/or filtered data (e.g., pixel data from the filter module 108). Examples of thermography modules and methods are provided in U.S. Prov. App'n No. 62/043,005, entitled "Image Display and Thermography for a Thermal Imaging Camera," filed Aug. 28, 2014, the entire contents of which is incorporated by reference herein.

The image processing system 100 includes a histogram equalization module 112, or other display conversion module, configured to prepare the image data for display on the display 116. In some imaging systems, the digital resolution of the pixel values from the focal plane array 102 can exceed the digital resolution of the display 116. The histogram equalization module 112 can be configured to adjust pixel values to match the high resolution value of an image or a portion of an image to the lower resolution of the display 116. The histogram module 112 can be configured to adjust pixel values of the image in a manner that avoids using the limited display range of the display 116 on portions of the image where there is little or no data. This may be advantageous for a user of the imaging system 100 when viewing images acquired with the imaging system 100 on the display 116 because it can reduce the amount of display range that is not utilized. For example, the display 116 may have a digital brightness scale, which for an infrared image corresponds to temperature where higher intensity indicates a higher temperature. However, the display brightness scale, for example a grey scale, is generally a much shorter digital word than the pixel sample words. For instance, the sample word of the pixel data may be 14 bits while a display range, such as grey scale, can be typically 8 bits. So for display purposes, the histogram equalization module 112 can be configured to compress the higher resolution image data to fit the display range of the display 116. Examples of algorithms and methods that may be implemented by the histogram equalization module 112 are disclosed in U.S. patent application Ser. No. 14/292,124, entitled "Data Digitization and Display for an Imaging System," filed May 30, 2014, the entire contents of which is incorporated by reference herein.

The imaging system 100 includes a display processing module 114 configured to prepare the pixel data for display on the display 116 by, for example, selecting color tables to convert temperatures and/or pixel values to color on a color display. As an example, the display processing module can include a colorizer lookup table configured to convert pixel data and/or temperature data into color images for display on the display 116. The colorizer lookup table can be configured to display different temperatures of a thermally imaged scene using different color display lookup tables depending at least in part on the relationship of a temperature of a given scene to a threshold temperature. For example, when a thermal image of a scene is displayed, various temperatures of the scene may be displayed using different lookup tables depending on their relationship to the input temperature. In some embodiments, temperatures above, below, or equal to an input temperature value may be displayed using a color lookup table, while other temperatures may be displayed using a grey scale lookup table. Accordingly, the colorizer lookup table can be configured to apply different colorizing lookup tables depending on temperature ranges within a scene in combination with user preferences or selections. Additional examples of functionality provided by a display processing module are described in U.S. Prov. App'n No. 62/049,880, entitled "Selective Color Display of a Thermal Image," filed Sep. 12, 2014, the entire contents of which is incorporated herein by reference in its entirety.

The display 116 can be configured display the processed image data. The display 116 can also be configured to accept input to interact with the image data and/or to control the imaging system 100. For example, the display 116 can be a touchscreen display.

The imaging system 100 can be provided as a standalone device, such as a thermal sensor. For example, the imaging system 100 can include an imaging system housing configured to enclose hardware components (e.g., the focal plane array 102, read out electronics, microprocessors, data storage, field programmable gate arrays and other electronic components, and the like) of the imaging system 100. The imaging system housing can be configured to support optics configured to direct light (e.g., infrared light, visible light, etc.) onto the image sensor 102. The housing can include one or more connectors to provide data connections from the imaging system 100 to one or more external systems. The housing can include one or more user interface components to allow the user to interact with and/or control the imaging system 100. The user interface components can include, for example and without limitation, touch screens, buttons, toggles, switches, keyboards, and the like.

In some embodiments, the imaging system 100 can be part of a network of a plurality of imaging systems. In such embodiments, the imaging systems can be networked together to one or more controllers.

Figure 1B:
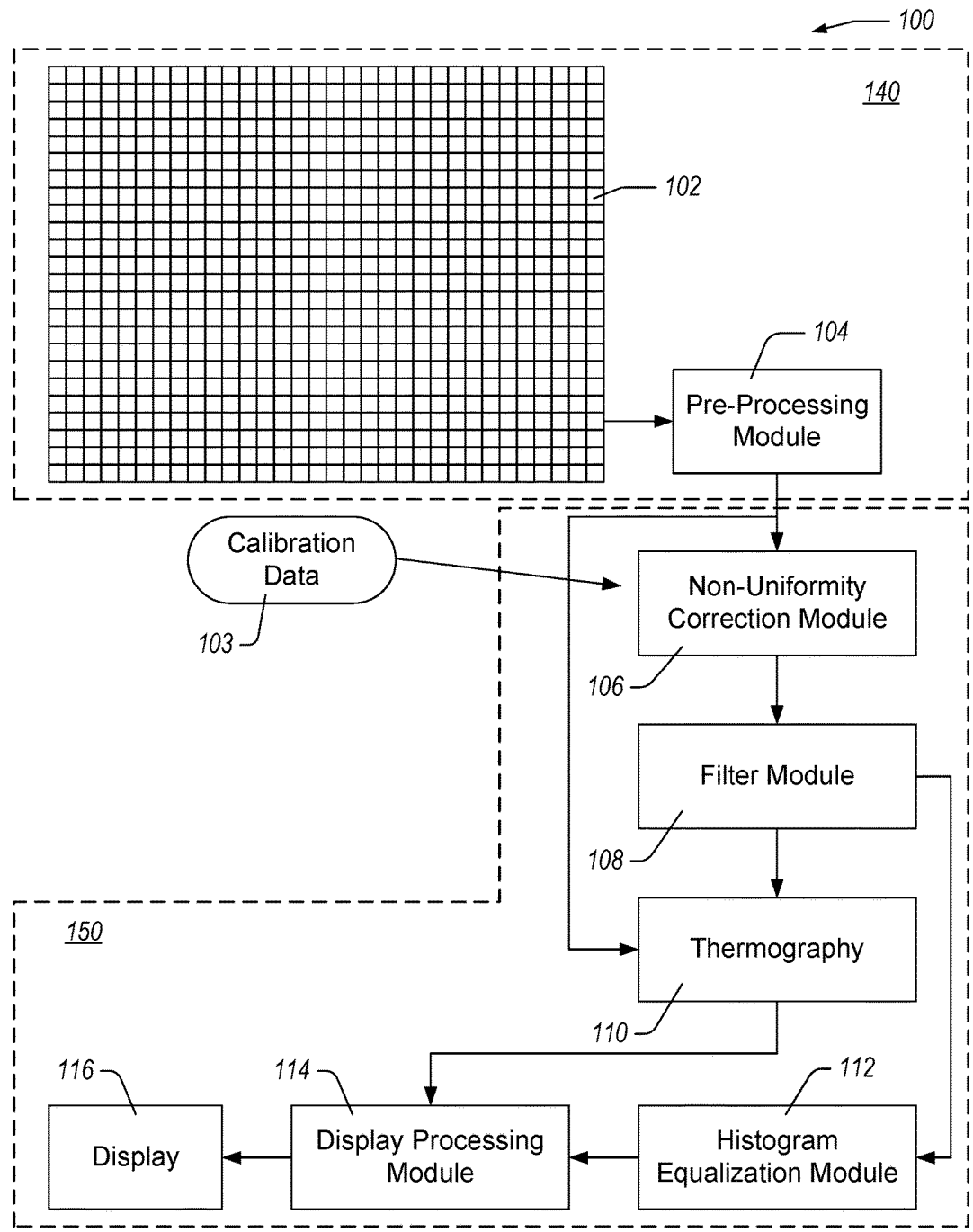
FIG. 1B illustrates a functional block diagram of the example imaging system illustrated in FIG. 1A, wherein functionality of the imaging system is divided between a camera and a mobile electronic device.

FIG. 1B illustrates a functional block diagram of the example imaging system 100 illustrated in FIG. 1A, wherein functionality of the imaging system 100 is divided between a camera or sensor 140 and a mobile electronic device 150. By dividing image acquisition, pre-processing, signal processing, and display functions among different systems or devices, the camera 140 can be configured to be relatively low-power, relatively compact, and relatively computationally efficient compared to an imaging system that performs a majority or all of such functions on board. As illustrated in FIG. 1B, the camera 140 is configured to include the focal plane array 102 and the pre-processing module 104. In some embodiments, one or more of the modules illustrated as being part of the mobile electronic device 150 can be included in the camera 140 instead of in the mobile electronic device 150. In some embodiments, certain advantages are realized based at least in part on the division of functions between the camera 140 and the mobile electronic device 150. For example, some pre-processing functions can be implemented efficiently on the camera 140 using a combination of specialized hardware (e.g., field-programmable gate arrays, application-specific integrated circuits, etc.) and software that may otherwise be more computationally expensive or labor intensive to implement on the mobile electronic device 150. Accordingly, an aspect of at least some of the embodiments disclosed herein includes the realization that certain advantages may be achieved by selecting which functions are to be performed on the camera 140 (e.g., in the pre-processing module 104) and which functions are to be performed on the mobile electronic device 150 (e.g., in the thermography module 110).

An output of the camera 140 can be a stream of digital data representing pixel values provided by the pre-processing module 104. The data can be transmitted to the mobile electronic device 150 using electronic connectors (e.g., a micro-USB connector, proprietary connector, etc.), cables (e.g., USB cables, Ethernet cables, coaxial cables, etc.), and/or wirelessly (e.g., using BLUETOOTH, Near-Field Communication, Wi-Fi, etc.). The mobile electronic device 150 can be a smartphone, tablet, laptop, or other similar portable electronic device. In some embodiments, power is delivered to the camera 140 from the mobile electronic device 150 through the electrical connectors and/or cables.

The imaging system 100 can be configured to leverage the computing power, data storage, and/or battery power of the mobile electronic device 150 to provide image processing capabilities, power, image storage, and the like for the camera 140. By off-loading these functions from the camera 140 to the mobile electronic device 150, the camera can have a cost-effective design. For example, the camera 140 can be configured to consume relatively little electronic power (e.g., reducing costs associated with providing power), relatively little computational power (e.g., reducing costs associated with providing powerful processors), and/or relatively little data storage (e.g., reducing costs associated with providing digital storage on the camera 140). This can reduce costs associated with manufacturing the camera 140 due at least in part to the camera 140 being configured to provide relatively little computational power, data storage, and/or power, because the imaging system 100 leverages the superior capabilities of the mobile electronic device 150 to perform image processing, data storage, and the like.

Example Gain of a Photodetector and Integrator Circuit

Figure 2:
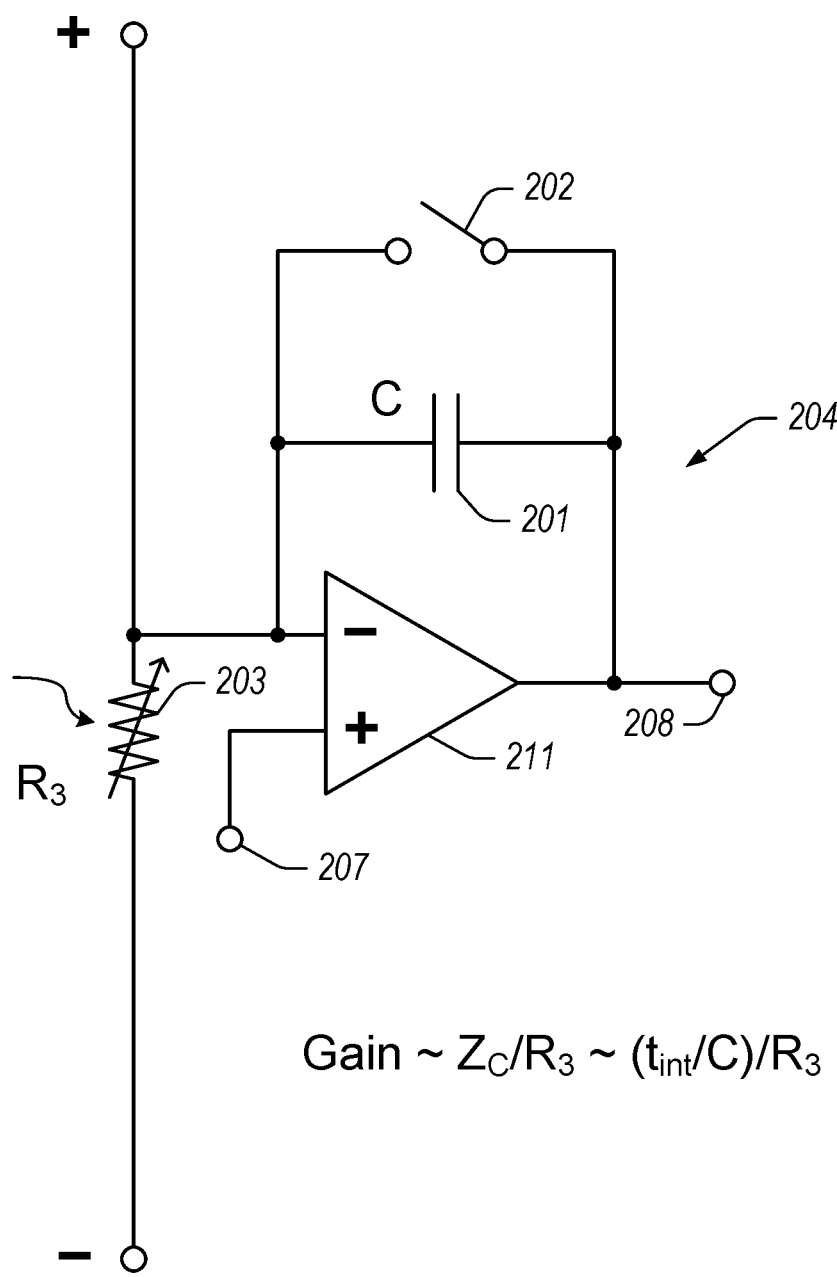
FIG. 2 illustrates an electrical schematic diagram of an example circuit for a photodetector and integrator with a relationship between gain and integration capacitance.

FIG. 2 illustrates an electrical schematic diagram of an example circuit for a photodetector and integrator with a relationship between gain and integrator capacitance. It should be noted that the electrical schematic diagram is simplified for description purposes. The electrical schematic diagram thus does not include all of the electrical components that are typically included for an array of photodetectors implemented with an ROIC. The circuit includes a photodetector 203 that may be one of an array of pixels, such as in a 2-dimensional array of pixels or in a linear array, but the photodetector may also be a single detector. The photodetector 203 is responsive to radiation in a spectral region of interest, such as infrared light and/or visible light. The circuit includes an integrator 204 comprising an operational amplifier 211, an integrator capacitor 201, and an integrator time control 202 (e.g., a switch to open or short the integrator capacitor 201) in feedback. The other terminal of the operational amplifier 211 can receive an integrator bias voltage 207 as input. In certain implementations, the integrator bias voltage can be configured to establish a reference bias level (e.g., an output signal when the photodetector 203 is exposed to a flat field scene) that is around a mid-point of an operating voltage of the circuit.

The gain of the illustrated circuit can be proportional to the transimpedance of the integrator capacitor 201, $Z_c$. The transimpedance of the integrator capacitor 201 can be, to an approximation, proportional to the integration time, $t_{int}$, divided by the capacitance, C, of the integrator capacitor 201. This gain value can be used by image processing elements of the imaging system to generate corrected or adjusted image data from data acquired with the photodetector 203, which may be part of an imaging array. Knowing the gain value for the photodetector 203, then, may advantageously improve resultant image quality. In certain implementations, gain information can be stored and/or accessed as a pixel gain table, such as a stored function or a lookup table. In certain implementations, the photodetector 203 may be a detector in an array of un-cooled microbolometers. For example, this may be the case for mass-produced thermal imaging systems. However, the disclosed systems and methods can provide benefits for detector read out circuits with a front-end integrator.

The gain of the circuit can depend on the capacitance of the integrator capacitor 201. The circuit can be designed to provide or achieve a targeted gain based at least in part on the nominal capacitance of the integrator capacitor 201. However, as described herein, the actual capacitance of the integrator capacitor 201 can deviate from the nominal capacitance. When this occurs, it is advantageous to adjust a gain factor associated with a photodetector to account for the actual capacitance. This can be done, for example, to achieve an expected signal output where the actual gain of the photodetector readout circuit has changed. For example, in the photodetector circuits described herein and for the imaging systems disclosed herein, voltages across the integrator capacitor can be close to 0, can be relatively small, can range from negative to positive voltages, and the like. In some of these voltage ranges (e.g., when the voltage across the capacitor is close to zero), the actual capacitance is significantly different from the nominal capacitance of the capacitor. As described above, the gain of the readout circuit is related to the capacitance of the integrator capacitor. Accordingly, the gain factor changes for the circuit when the capacitance changes. This may be undesirable because the readout circuit may be designed to have a targeted gain factor based on the nominal capacitance of the integrator capacitor. Accordingly, gain correction factors or modified gain factors can be determined based on signal voltages, wherein these correction factors are determined using the disclosed gain calibration methods and systems. In addition, using modified or corrected gain factors can increase photodetector response uniformity. When photodetectors are exposed to different levels of radiation, they generate different levels of response. However, the characteristics of the photodetector may change with different signal levels, which may be undesirable. To compensate for these possible changes, the disclosed gain calibration methods and systems can be used to determine adjusted or modified gain factors to maintain expected photodetector response uniformity (e.g., where response uniformity can mean the photodetectors respond uniformly based on designed gain factors, not necessarily that all photodetectors produce the same output with the same input because, for instance, operating biases may differ).

Figure 3C:
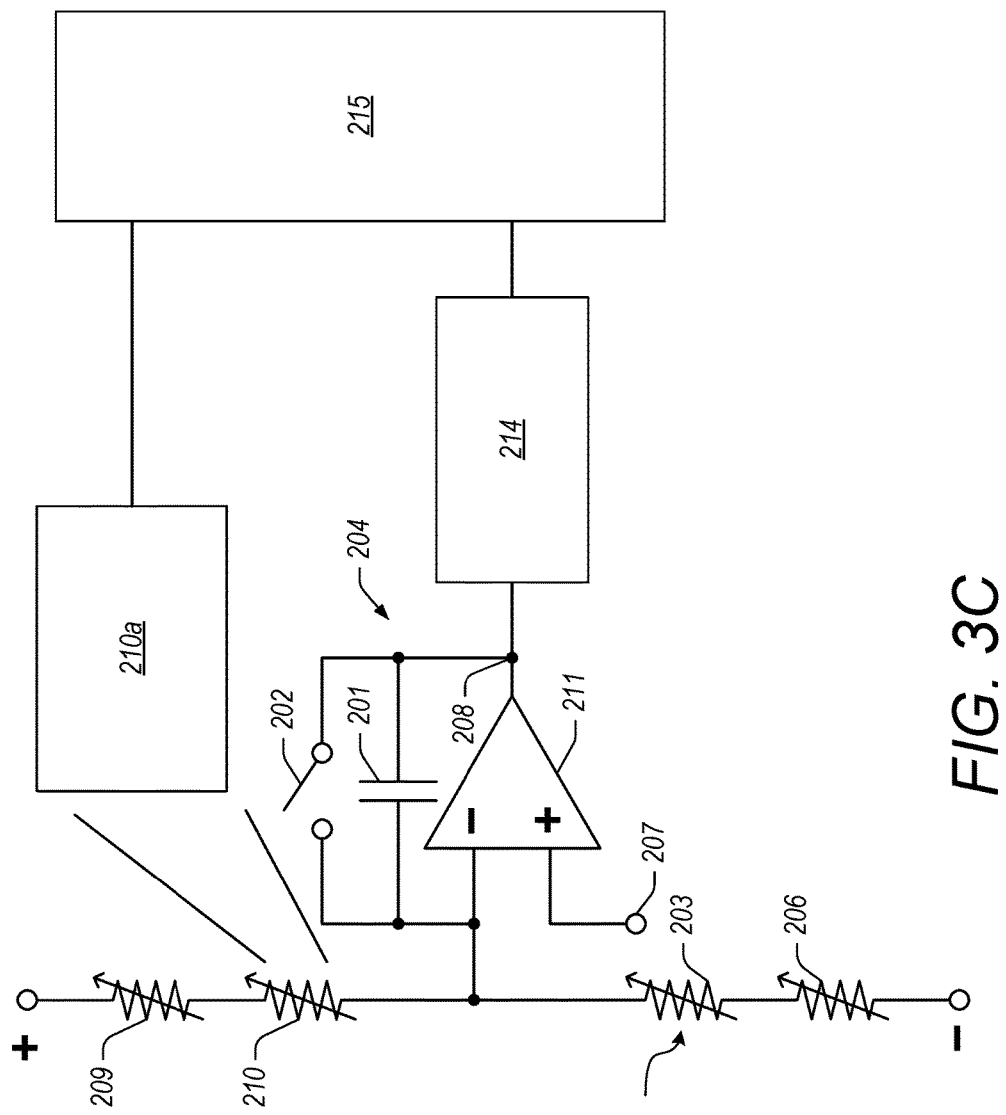

FIGS. 3A-3C illustrate electrical schematic diagrams of example circuits for photodetectors in an imaging system. The example circuits can be used to bias an operating point of a photodetector (e.g., a pixel), and to determine a gain factor as a function of signal voltage at an integrator. As illustrated, the schematic diagrams are limited to a portion of the circuitry for the photodetector of an example FPA with microbolometers. The schematic diagrams are also limited in that the circuitry includes elements related to setting operating biases and control while other circuitry that may be present in the imaging system is not shown or discussed. It should be noted that other detector types and other implementations using microbolometers may use other circuit designs and these circuit designs may also benefit from the disclosed gain calibration processes. Thus, the systems and methods disclosed herein may be implemented on many types of FPAs used for a variety of imaging applications.

With reference to FIG. 3A, the circuit includes a photodetector 203 (e.g., a microbolometer) electrically coupled to voltage rails providing voltage to the imaging array. The circuit includes adjustable voltage setting elements 205, 206 that can be configured to be uniquely set for each photodetector 203 to establish an operating bias of the photodetector 203. Such an arrangement may be beneficial for a number of reasons. For example, photodetector responsivity to radiation, signal to noise, and the like may depend on the voltage across the photodetector, and may vary from photodetector to photodetector across an imaging array as well as from imaging array to imaging array. Thus, it may be advantageous to be able to adjust operating biases of photodetectors globally and locally. As another example, photodetectors in an array can be configured to have similar operating ranges.

The photodetector 203 is connected to an integrator 204 that includes an operational amplifier 211, integrator capacitor 201, and integrator switch 202, and whose output 208 is a signal representing the intensity of radiation intensity incident on photodetector 203. The integrator 204 may be biased itself by integrator bias voltage 207. In certain implementations, the integrator bias voltage 207 can be configured so that when the photodetector 203 is exposed to a flat field scene, the output signal 208 of the integrator 204 can be within a targeted reference bias output range.

FIG. 3B illustrates an electrical schematic diagram of another example circuit for photodetectors in an imaging system. In this embodiment, the electrical schematic includes a network of resistors configured to provide a tailored operating bias to individual photodetectors in the imaging array. The circuit includes a global biasing element 209 (e.g., a variable resistor such as a resistor network) that may be globally set for all photodetectors in the imaging array. The global biasing element 209 can be used as an overall coarse adjustment of operating biases for the imaging array. The circuit includes a focused biasing element 206 (e.g., a variable resistor such as a resistor network) that may be coupled to photodetectors in a column or row of the imaging array. The focused biasing element 206 can be used as a more focused adjustment of operating biases for photodetectors in the associated column or row. The circuit includes a fine biasing element 210 (e.g., a variable resistor such as a resistor network) that may be associated with the particular photodetector 203. The fine biasing element 210 can be used as a fine adjustment of the operating bias for the individual photodetector 203. Thus, the biasing elements 206, 209, and 210 can be used in combination to set tailored operating biases for each photodetector in the imaging array. Not shown are various switches that may be used to selectively couple photodetectors to the electrical system of the imaging system, such as when each photodetector is interrogated. For instance, the photodetector 203 and the fine biasing element 210 may be configured to be associated with an individual pixel of the imaging array while other elements such as the other biasing elements 206, 209 and the integrator 204 may be configured to be associated with a particular column or row, these elements being switched to couple to an individual photodetector 203 as that particular photodetector is read out.

FIG. 3C illustrates additional components for the electrical schematic diagram of FIG. 3B. The output signal 208 is delivered to an analog-to-digital converter 214 to convert the pixel data to digital data. The digital data can be delivered to a processing element 215, such as a system controller. The processing element 215, in some embodiments, can be configured to determine and/or apply calibrated gain factors for application to the output signal. Fine control of the operating bias for the individual photodetector 203 can be provided by a fine control element 210a. The fine control element 210a can be controlled by the processing element 215. The elements controlling the operating biases (e.g., biasing elements 206, 209, 210 and/or fine control element 210a) may be implemented in various configurations. For example, biasing elements 206, 209 and 210 may be implemented as resistor networks that can be configured under control of the processing element 215. In certain implementations, one or more of the biasing elements 206, 209, 210 can be controlled digitally through the use of digital words sent from the processing element 215 to the particular biasing element.

As a particular example, for illustration purposes, the fine control element 210a, which can be a resistor digital-to-analog converter ("RDAC") in certain implementations, may be configured as a 7-bit resistor network, with the least significant bit ("LSB") equivalent to about 1 kΩ, thus allowing the RDAC to be set to values between about 1 kΩ and about 128 kΩ in increments of about 1 kΩ. Focused biasing element 206 may be a 4-bit resistor network with the LSB equivalent to about 4 kΩ. Global biasing element 209 may be configured to be selected from a few values, such as about 25 kΩ, about 50 kΩ, and about 75 kΩ. The biasing elements can be adjusted through switches, for example, under control of the processing element 215. Thus, in this illustrative embodiment, the overall bias network has a resistance in the range of tens of kilo-ohms, with a fine adjustment of the resistance for individual photodetectors in increments of about 1 kΩ. In some implementations of imaging arrays with microbolometers, the photodetectors may have resistances on the order of tens of kilo-ohms at room temperature. In such a configuration, the total resistance of the photodetector circuit can be on the order of about 100 kΩ. With a fine adjustment control of about 1 kΩ, the operating bias voltage across the photodetector 203 may be controlled with a resolution of about 1%, thereby providing for effective control of operating biases for each photodetector in the imaging array. In certain implementations, the integrator capacitor 201 can have a nominal capacitance of about 25 pF and an integration time of about 200 µs, resulting in the transimpedance of the capacitor being about 8 MΩ. In various implementations, a resistor network configured to control the operating bias of a micobolometer can have a resistance of about 100 kΩ. In such a configuration, a gain of about 100 can be produced. Such a detector circuit with processor-controlled resistor networks is described in greater detail in U.S. Prov. Pat. App'n No. 62/039,566, filed Aug. 20, 2014, entitled "Adaptive Adjustment of the Operating Bias of an Imaging System," the entire contents of which is incorporated by reference herein.

Example Calibration of Gain for a Photodetector Circuit

Figure 4:
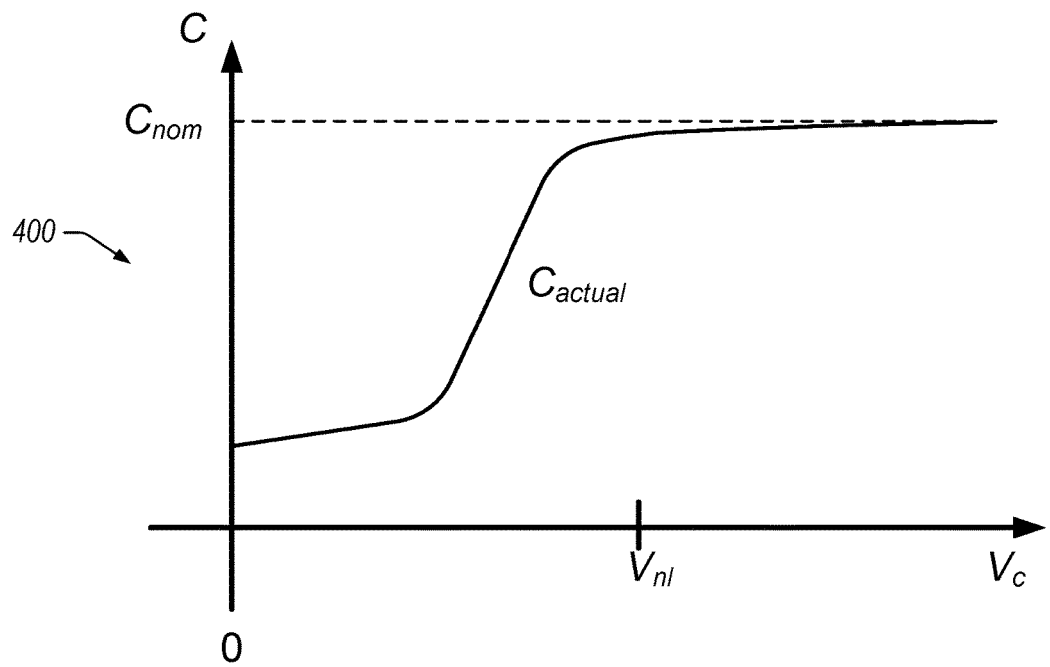
FIG. 4 illustrates an example relationship between voltage across a capacitor and actual capacitance compared to nominal capacitance.

FIG. 4 illustrates a graph 400 of example capacitance of some types of capacitors as a function of voltage across the capacitors. As shown in the graph 400, the actual capacitance, $C_{actual}$, may deviate from the nominal capacitance, $C_{nom}$, of a capacitor for some voltage values. It may be advantageous to determine the value of the actual capacitance, $C_{actual}$, as a function of voltage across the capacitor rather than relying on the nominal capacitance, $C_{nom}$. In the circuits described herein, the actual capacitance can be related to a gain of the read out circuitry for a photodetector. Thus, an imaging system that uses the actual capacitance of an integrator capacitor in addition to or in place of the nominal capacitance can generate a higher quality image compared to a system that relies on the nominal capacitance, due at least in part to the use of a more accurate gain factor.

This process for determining actual capacitance may be particularly beneficial for at least some of the electrical circuits described herein as these circuits may be at least partially formed on a ROIC, such as in a silicon microcircuit medium like a metal-oxide-semiconductor. The integrator capacitor 201, for example, can be manufactured in this way. Such a capacitor is not a physical-structured capacitor, such as a ceramic capacitor, but is rather typically formed by implanted regions of mobile carriers and holes. The behavior of such a capacitor is not necessarily determined by physical geometry but may in fact be affected by the voltage across the capacitor, $V_C$. The voltage, depending at least in part on polarity, may affect the migration and depletion of the carriers in such a capacitor. Thus, the actual capacitance of such a micro-fabricated capacitor may behave in a manner similar to that illustrated in the graph 400. As illustrated, such capacitors may be at or near a nominal design value for capacitance, $C_{nom}$, for a range of voltages across the capacitor but may deviate from the nominal value for other voltage ranges. The voltage across the capacitor, $V_{n1}$, at which deviation from nominal capacitance becomes significant may be for relatively low voltages in many cases, as illustrated by the curve shown in graph 400.

In addition, this process for determining actual capacitance may be particularly beneficial for integrators that are part of ROICs that are configured to operate at positive and negative voltages. For some imaging array read out circuits (e.g., FPA read out circuits) that benefit from operating at high speed while maintaining low power consumption, it may be preferable to operate integrators such that the voltage across the capacitor can range from negative to positive values. Such an arrangement advantageously allows greater flexibility in setting reference bias levels due at least in part to the ability to set a reference bias level so that at least some of the expected signals will produce a negative voltage from the integrator. Also, operating with positive and negative voltages can advantageously mean that voltages across the integrator capacitor are generally closer to zero when the integrator is reset (e.g., shorting and thus discharging the capacitor) than if it was configured to operate only using positive voltages. For example, using only positive voltages may result in voltages across the integrator capacitor being as much as twice as high as it would be if the integrator capacitor was operated with positive and negative voltages. Advantageously, keeping the discharge voltage low may decrease current surges in the ROIC which may be preferable for designs that emphasize relatively high speed and/or low power consumption. Due at least in part to the electrical circuits being operated with both positive and negative output voltages from the integrator, the actual capacitance of the integrator capacitance may deviate from the nominal capacitance, making it beneficial to determine and compensate for this effect. Furthermore, the actual capacitance of the integrator capacitor may not be readily predicted from design models, making the disclosed methods of determining and characterizing the actual capacitance as a function of output signal particularly beneficial in imaging systems employing similar circuit designs.

Figure 5:
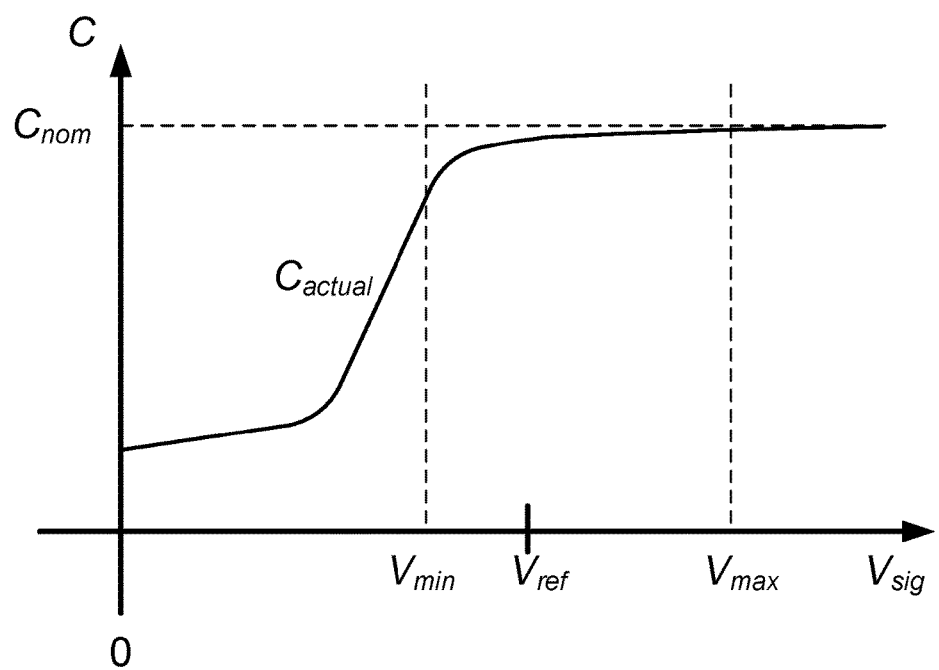
FIG. 5 illustrates an example relationship between voltage across a capacitor and actual capacitance compared to nominal capacitance in a circuit such as those of FIGS. 2-3C.

FIG. 5 illustrates the behavior of an integrator capacitor, such as integrator capacitor 201, where the integrator bias voltage is not zero and the integrator 204 is operated so that a reference bias level, $V_{ref}$, is at a positive value that is roughly near a midpoint of an operating range of the photodetector circuit. The reference bias level, $V_{ref}$, may be chosen at a convenient point somewhere between expected minimum and maximum detector signals, but not necessarily centered. For an uncooled thermal imager, for example, the imaging system may be adjusted so that the reference bias level is at or near the expected signal of room temperature objects in a scene. Thus, heated objects or surfaces (e.g., living creatures) may produce positive signals across the integrator capacitor 201 while cooler items (e.g., water, ice, etc.) may produce negative signals across the integrator capacitor 201. Such an operating regime may likely be affected by capacitor behavior as lower voltage values, including negative voltages, may be present across the integration capacitor in operation. For example, in these lower ranges (e.g., below $V_{ref}$), the actual capacitance may deviate more extremely from the nominal capacitance relative to higher voltage ranges (e.g., above $V_{ref}$).

Figure 6:
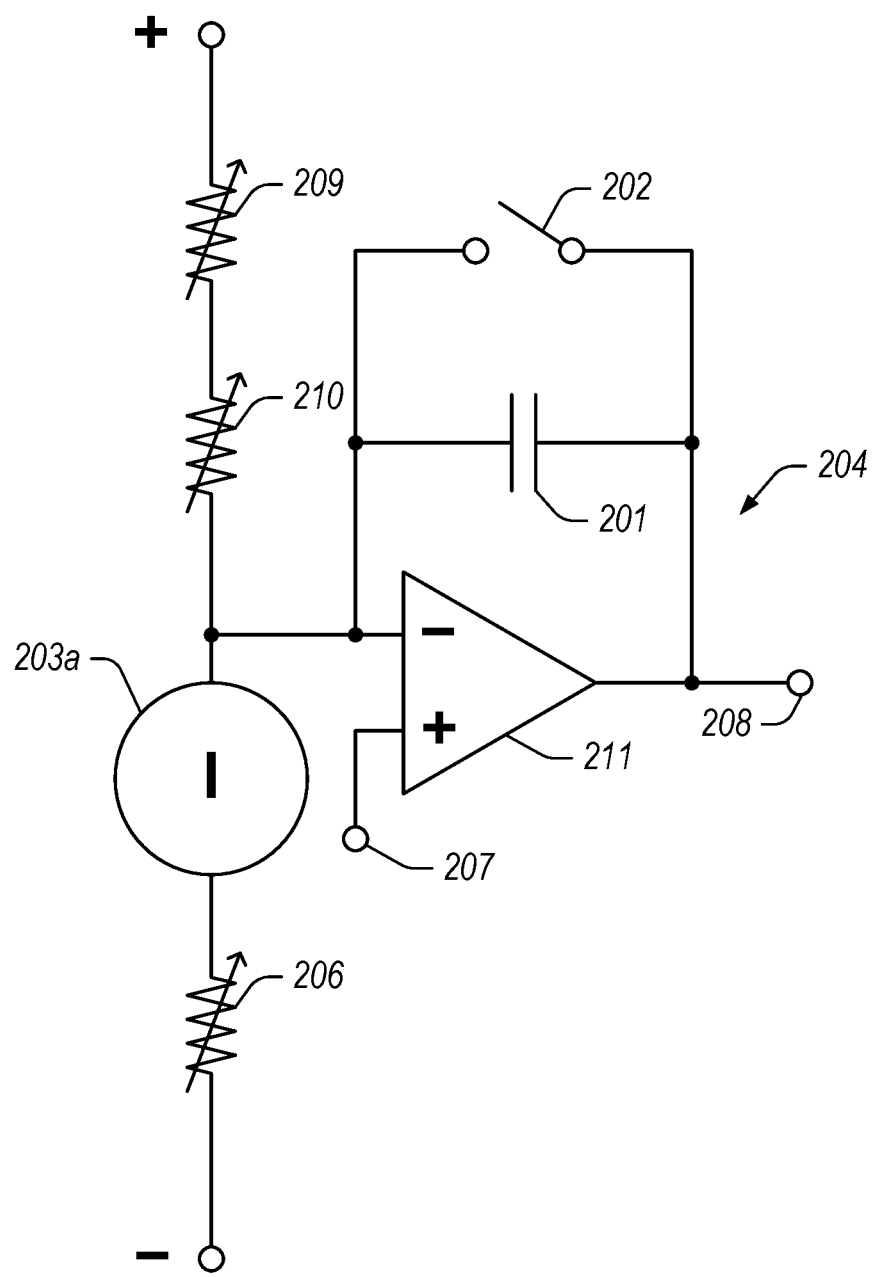
FIG. 6 illustrates an electrical schematic diagram of an example circuit for a photodetector and integrator in a test and calibration configuration.

FIG. 6 shows an illustrative embodiment of an ROIC with processor-controlled bias resistor networks (e.g., biasing elements 206, 209, 210), where a test current source 203a may be switched into the read out electronics in place of a photodetector, such as the photodetector 203 in FIGS. 3A-3C. Such an arrangement allows for calibration of the behavior of the integrator capacitor 201 across a targeted voltage range. In an illustrative read out circuit, the resistor networks (e.g., biasing elements 206, 209, 210) and the integration time (e.g., the time between closing and opening the integrator switch 202, or $t_{int}$) may be varied under control of the processing element, such as the processing element 215 in FIG. 3C. In such a configuration, a relatively large portion of available parameter space (e.g., ranges of resistance values and ranges of integration time values that are likely to be used in the imaging system) may be explored to characterize the actual capacitance of the integrator capacitor 201.

Figure 7A:
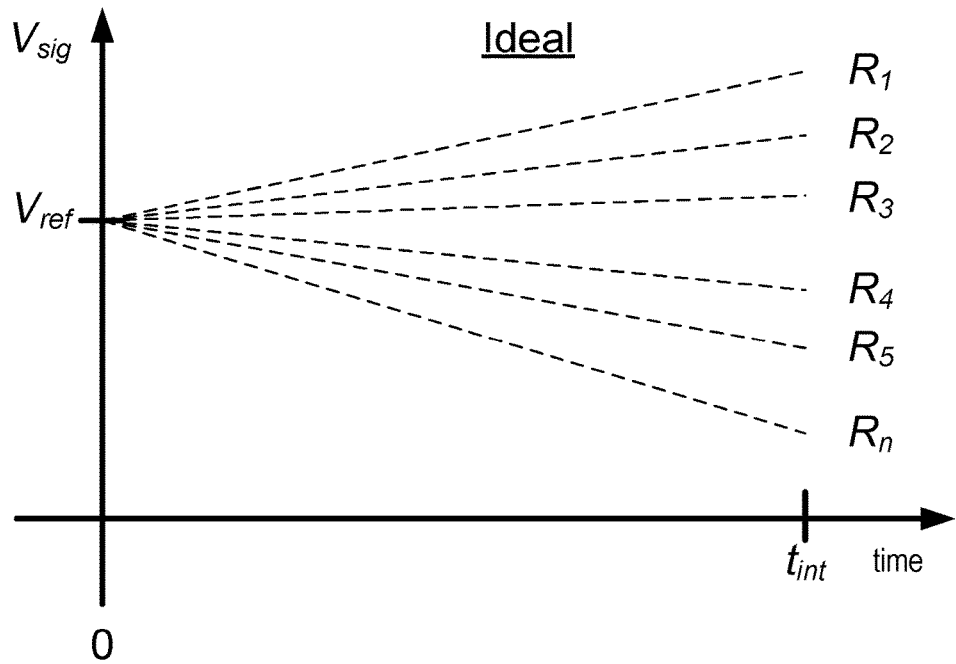
FIGS. 7A and 7B illustrate example integration curves, assuming nominal capacitance for various resistor settings using the example test circuit of FIG. 6, and example integration curves showing the effect of actual capacitance.

FIG. 7A illustrates data that would be expected if the capacitance of the integrator capacitor remains at its nominal capacitance for an expected range of signal voltages. By varying the resistance of the detector circuit and/or by varying the integration time, a series of linear integration curves can be determined where the endpoints are the signal voltages for each value of resistance (e.g., $R_1$ through $R_n$). The range of signal voltages, resistances, and integration times can be configured to be similar to ranges expected during operation of the imaging system.

Figure 7B:
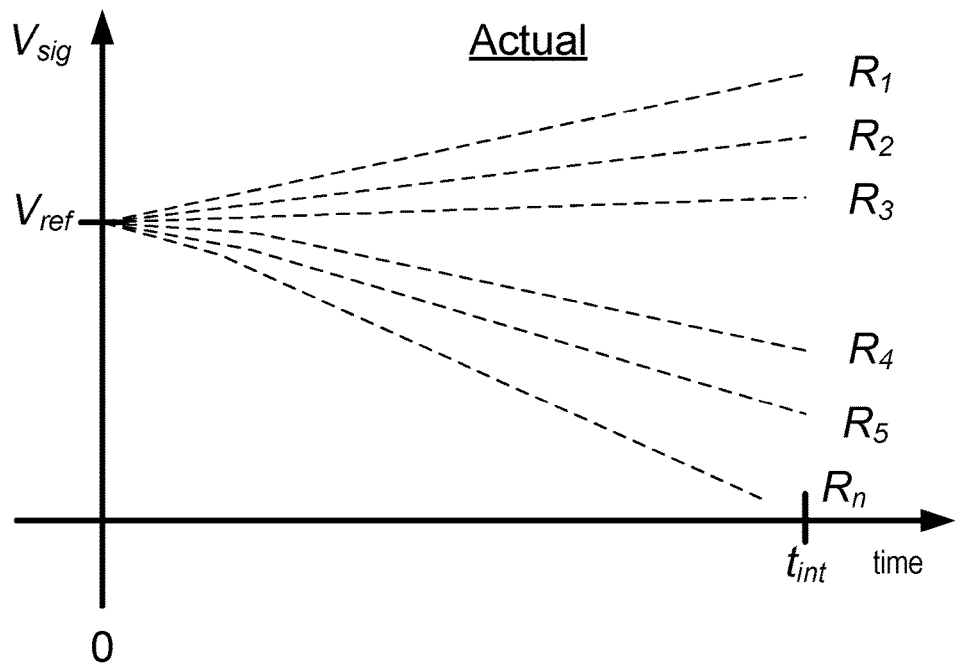

FIG. 7B illustrates an exemplary representation of actual data from such a test run with the conditions described above. Such curves indicate the gain of the integrator and deviation from the expected linear value illustrated in FIG. 7A. This deviation may be due at least in part to the change in capacitance of the integrator capacitor as a function of signal voltage across the capacitor, $V_C$. Thus the actual capacitance as a function of signal voltage, $V_{sig}$, may be determined from the known relationship between the signal voltage, $V_{sig}$, and capacitance of the integrator capacitor, $C_{actual}$.

Figure 8:
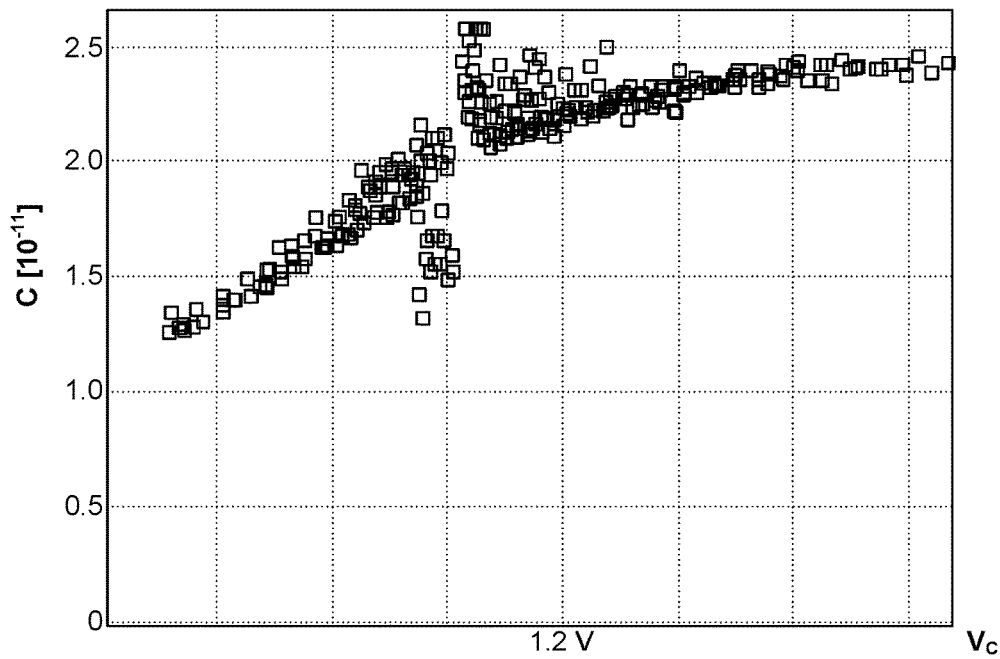
FIG. 8 illustrates an example graph of actual measured capacitance vs. voltage using an actual test circuit.
Figure 9:
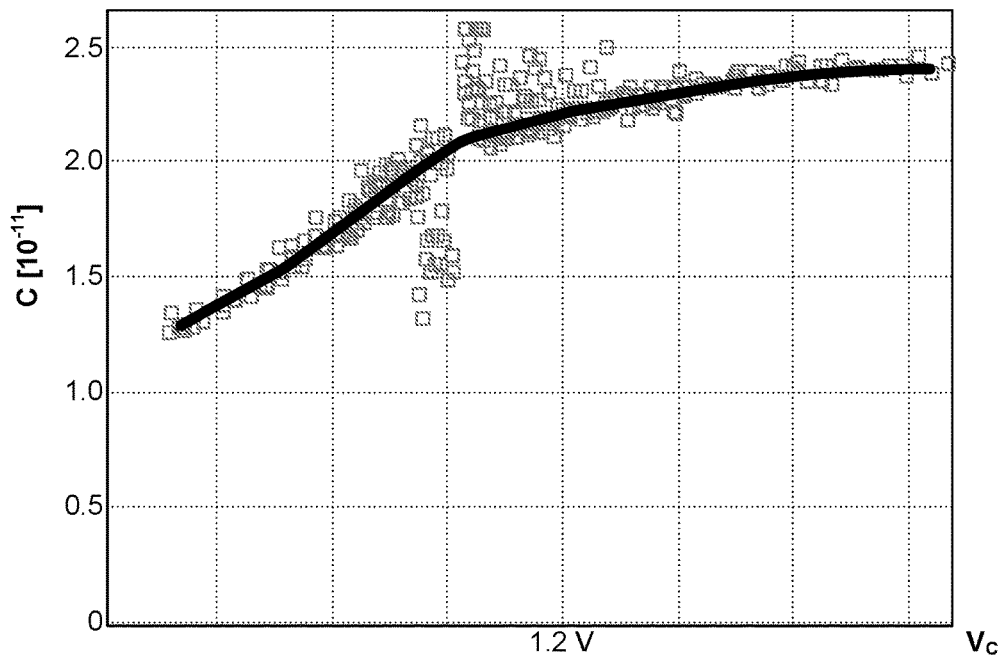
FIG. 9 illustrates a curve fit to the measured test data of FIG. 8.

In practice it may be desirable to acquire a relatively large amount of data. The resistor networks may be varied in patterns to acquire the data at a large number of resistance values. Also, tests may be performed using varying integration times for individual resistor values since the relationship between capacitance, gain and integration time is known. In an exemplary circuit, such as for a focal plane array, the integration time may be controllable by the processor by controlling the opening and closing of the integrator switch (e.g., integrator switch 202 in FIG. 3C) across the integrator capacitor (e.g., integrator capacitor 201 in FIG. 3C). FIGS. 8 and 9 illustrate examples of graphs of data acquired for measured integration capacitance for an FPA configured in the test configuration described herein for a plurality of circuit resistance values and integration times. With this information, data representing the actual capacitance as a function of voltage across the capacitor can be derived. For example, because the voltage across the capacitor is $V_{sig}-V_{ref}$, the actual capacitance is directly related to signal, and thus the gain can be known as a function of signal: $V_{out}=C_i*dV/dt$.

Although the exemplary FPA circuitry with the test current source has been described, other ways to determine integration capacitance may provide useful results. The actual detector may be utilized, and either the resistor network can be varied while the detector observes a constant temperature scene, or the scene varied by calibrated temperature amounts that result in known signal increments observed by the detector.

Once the capacitance data is determined, it may be used to adjust the gain values used by the system. One approach is illustrated in FIG. 9. A curve may be fit to the measured capacitance data, as described herein, that provides a derived mathematical relationship between $V_{sig}$ and $C_{actual}$, and thus the gain. For each observed value of signal voltage, $V_{sig}$, the actual gain may be calculated directly from this derived relationship.

Figure 10:
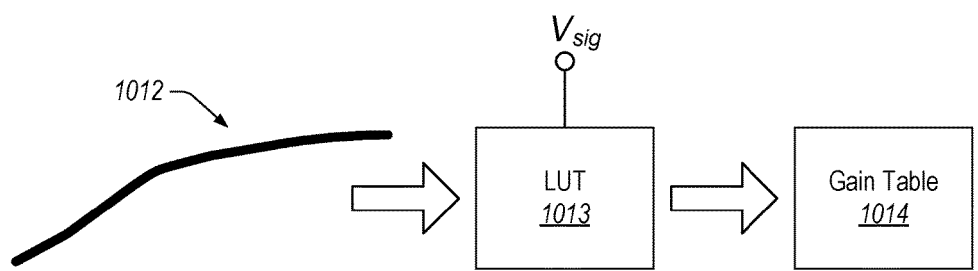
FIG. 10 illustrates an example of application of the curve fit to the system gain table.

An approach that may be beneficial for certain types of processors that are more efficient at memory operations than mathematical operations is illustrated in FIG. 10. Data from the fitted curve 1012 may be used to calculate a gain vs. signal Look up Table (LUT) 1013. This lookup table 1013 can be used to generate a gain table 1014 (e.g., determine one or more gain factors) as a function of signal, $V_{sig}$. Thus, for each measured signal from a given detector in a given frame of image data, the processor may directly set the pixel gain with a value from the LUT 1013 corresponding to the observed signal voltage. Thus, for each pixel, gain calibration may be applied continuously during imaging operation.

The capacitance can change as a function of voltage, which change may be due at least in part to effects resulting during the manufacture of the ROIC. For detector circuits manufactured with similar process parameters, it may be possible to determine the curve for one detector circuit on one FPA and use that curve and/or lookup table for pixels of FPAs of the same design. This may be done once or repeatedly to establish greater statistical significance in the results, if desired. However, particularly for an FPA such as the exemplary one described herein, the calibration of capacitance as a function of voltage may be automated and performed efficiently at for groups of pixels on an FPA or even individual pixels on an FPA. Thus, it may be possible to perform the calibration for one or more pixels and apply that to a plurality of FPAs (e.g., all FPAs manufactured under similar conditions and/or with similar designs) and may be include calibrating individual pixels of individual FPAs (e.g., each pixel in each FPA).

Example Method for Gain Calibration

Figure 11:
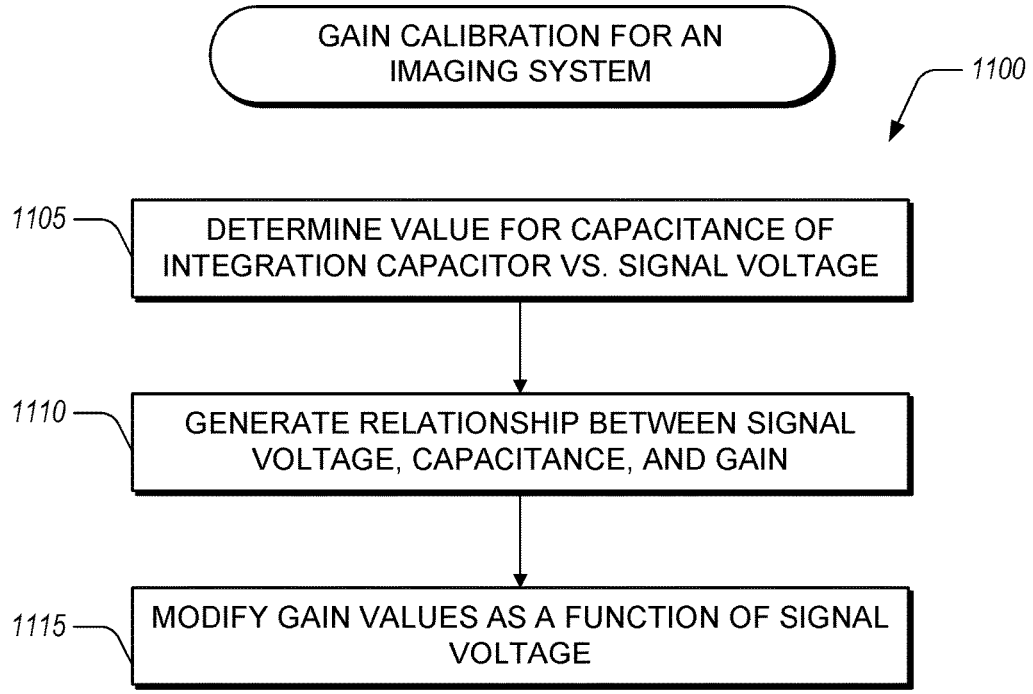
FIG. 11 illustrates a flow chart of an example method for gain calibration for an imaging system.

FIG. 11 illustrates a flow chart of an example method 1100 for gain calibration for an imaging system. The method 1100 can be implemented using one or more hardware components in an imaging system or image processing system. For ease of description, the method 1100 will be described as being performed by the imaging system 100 described herein with reference to FIGS. 1A and 1B. However, one or more of the steps of the method 1100 can be performed by any module or combination of modules in the imaging system 100. Similarly, any individual step can be performed by a combination of modules in the imaging system 100.

In block 1105, the imaging system determines a value for the capacitance of the integration capacitor as a function of a signal voltage across the capacitor. This can be done, for example, by varying the input current to the integrator over a plurality of known current and/or voltage values. This can also include integrating the input signal at the plurality of known input values, which can, in some embodiments, be repeated for a plurality of different integration times. To determine the value for the capacitance, the imaging system can further observe the signal voltage output by the integrator for the known input values and the known parameters (e.g., resistor network values, integrator bias levels, integration times, etc.). The imaging system can then compare the actual signal voltage to an expected signal assuming the capacitor had the nominal integration capacitance. Using this information, the imaging system can then calculate the actual integration capacitance as a function of signal voltage.

In block 1110, the imaging system generates a mathematical relationship between signal voltage, actual capacitance, and actual gain. This relationship can be generated by fitting a curve to the actual capacitance observed versus signal voltage, for example. The imaging system can also further determine a mathematical function relating actual gain to signal voltage from a fit to the acquired data and/or generate a look up table (LUT) from a function fit to the data, the LUT indexing actual gain to signal voltage.

In block 1115, the imaging system modifies the gain values used by the image processing or signal processing system as a function of signal voltage. In some embodiments, the gain modification is applied on a continuous basis during operation of the imaging system (e.g., while the imaging system is operating to acquire image data).

The embodiments described herein are exemplary. Modifications, rearrangements, substitute processes, etc. may be made to these embodiments and still be encompassed within the teachings set forth herein. One or more of the steps, processes, or methods described herein may be carried out by one or more processing and/or digital devices, suitably programmed.

Depending on the embodiment, certain acts, events, or functions of any of the algorithms described herein can be performed in a different sequence, can be added, merged, or left out altogether (e.g., not all described acts or events are necessary for the practice of the algorithm). Moreover, in certain embodiments, acts or events can be performed concurrently, e.g., through multi-threaded processing, interrupt processing, or multiple processors or processor cores or on other parallel architectures, rather than sequentially.

The various illustrative logical blocks, modules, and algorithm steps described in connection with the embodiments disclosed herein can be implemented as electronic hardware, computer software, or combinations of both. To clearly illustrate this interchangeability of hardware and software, various illustrative components, blocks, modules, and steps have been described above generally in terms of their functionality. Whether such functionality is implemented as hardware or software depends upon the particular application and design constraints imposed on the overall system. The described functionality can be implemented in varying ways for each particular application, but such implementation decisions should not be interpreted as causing a departure from the scope of the disclosure.

The various illustrative logical blocks and modules described in connection with the embodiments disclosed herein can be implemented or performed by a machine, such as a processor configured with specific instructions, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A processor can be a microprocessor, but in the alternative, the processor can be a controller, microcontroller, or state machine, combinations of the same, or the like. A processor can also be implemented as a combination of computing devices, e.g., a combination of a DSP and a microprocessor, a plurality of microprocessors, one or more microprocessors in conjunction with a DSP core, or any other such configuration. For example, the LUT described herein may be implemented using a discrete memory chip, a portion of memory in a microprocessor, flash, EPROM, or other types of memory.

The elements of a method, process, or algorithm described in connection with the embodiments disclosed herein can be embodied directly in hardware, in a software module executed by a processor, or in a combination of the two. A software module can reside in RAM memory, flash memory, ROM memory, EPROM memory, EEPROM memory, registers, hard disk, a removable disk, a CD-ROM, or any other form of computer-readable storage medium known in the art. An exemplary storage medium can be coupled to the processor such that the processor can read information from, and write information to, the storage medium. In the alternative, the storage medium can be integral to the processor. The processor and the storage medium can reside in an ASIC. A software module can comprise computer-executable instructions which cause a hardware processor to execute the computer-executable instructions.

Conditional language used herein, such as, among others, "can," "might," "may," "e.g.," and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment. The terms "comprising," "including," "having," "involving," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list.

Disjunctive language such as the phrase "at least one of X, Y or Z," unless specifically stated otherwise, is otherwise understood with the context as used in general to present that an item, term, etc., may be either X, Y or Z, or any combination thereof (e.g., X, Y and/or Z). Thus, such disjunctive language is not generally intended to, and should not, imply that certain embodiments require at least one of X, at least one of Y or at least one of Z to each be present.

The terms "about" or "approximate" and the like are synonymous and are used to indicate that the value modified by the term has an understood range associated with it, where the range can be ±20%, ±15%, ±10%, ±5%, or ±1%. The term "substantially" is used to indicate that a result (e.g., measurement value) is close to a targeted value, where close can mean, for example, the result is within 80% of the value, within 90% of the value, within 95% of the value, or within 99% of the value.

Unless otherwise explicitly stated, articles such as "a" or "an" should generally be interpreted to include one or more described items. Accordingly, phrases such as "a device configured to" are intended to include one or more recited devices. Such one or more recited devices can also be collectively configured to carry out the stated recitations. For example, "a processor configured to carry out recitations A, B and C" can include a first processor configured to carry out recitation A working in conjunction with a second processor configured to carry out recitations B and C.

While the above detailed description has shown, described, and pointed out novel features as applied to illustrative embodiments, it will be understood that various omissions, substitutions, and changes in the form and details of the devices or algorithms illustrated can be made without departing from the spirit of the disclosure. As will be recognized, certain embodiments described herein can be embodied within a form that does not provide all of the features and benefits set forth herein, as some features can be used or practiced separately from others. All changes which come within the meaning and range of equivalency of the claims are to be embraced within their scope.

What is claimed is:

1. A method for calibration of a circuit on a microfabricated chip, the circuit comprising a capacitor having a nominal capacitance, wherein an input/output relationship of the circuit is based on the nominal capacitance of the capacitor and is used by a processing system, the method comprising:
   measuring an actual output signal of the circuit as a function of an input voltage of the circuit during calibration of the circuit;
   determining an actual input/output relationship between the actual output signal of the circuit and an actual capacitance of the capacitor, based on determining the actual capacitance as a function of the input voltage during calibration; and
   modifying the nominal capacitance contribution to the input/output relationship used by the processing system using the actual capacitance, wherein the output signal is an input to determining the actual capacitance during operation of the circuit,
   wherein the actual capacitance of the capacitor is variable based on a voltage across the capacitor, the voltage across the capacitor being based at least in part on the input voltage of the circuit.

2. The method of claim 1, wherein determining the actual capacitance comprises:
   varying the input voltage over a plurality of known values;
   observing the output signal at the plurality of input voltages;
   comparing the output signal to an expected output signal corresponding to the nominal capacitance; and
   calculating the actual capacitance as a function of the output signal.

3. The method of claim 2, wherein determining the actual capacitance further comprises fitting a curve to the determined actual capacitance as a function of the output signal.

4. The method of claim 1 further comprising developing a look up table that indexes the actual input/output relationship to the actual output signal, wherein the look up table is based on modification of the input/output relationship due to the actual capacitance.

5. The method of claim 1, wherein the actual input/output relationship is updated on a substantially continuous basis during operation of the circuit.

6. A system comprising:
   a microfabricated chip, the microfabricated chip having a circuit thereon, the circuit comprising a capacitor having a nominal capacitance, wherein an input/output relationship of the circuit is based on the nominal capacitance; and
   a processor in communication with the microfabricated chip and configured to use the input/output relationship of the circuit, wherein the system is configured to calibrate the circuit by:
      measuring an actual output signal of the circuit of the circuit as a function of an input voltage of the circuit during calibration of the circuit;
      determining an actual input/output relationship between the actual output signal of the circuit and an actual capacitance of the capacitor, based on determining the actual capacitance as a function of the input voltage during calibration; and
      modifying the nominal capacitance contribution to the input/output relationship used by the processor using the actual capacitance, wherein the output signal is an input to determining the actual capacitance during operation of the circuit,
   wherein the actual capacitance of the capacitor is variable based on a voltage across the capacitor, the voltage across the capacitor being based at least in part on the input voltage of the circuit.

7. The system of claim 6, wherein determining the actual capacitance comprises:
   varying the input voltage over a plurality of known values;
   observing the output signal at the plurality of input voltages;
   comparing the output signal to an expected output signal corresponding to the nominal capacitance; and
   calculating the actual capacitance as a function of the output signal.

8. The system of claim 7, wherein determining the actual capacitance further comprises fitting a curve to the determined actual capacitance as a function of the output signal.

9. The system of claim 6, wherein the processor is further configured to develop a look up table that indexes the actual input/output relationship to the actual output signal, wherein the look up table is based on modification of the input/output relationship due to the actual capacitance.

10. The system of claim 6, wherein the actual capacitance of the capacitor is variable based on a voltage across the capacitor, the voltage across the capacitor being based at least in part on the input voltage of the circuit.

11. The system of claim 6, wherein the processor is configured to calibrate the circuit on a substantially continuous basis during operation of the circuit.

12. The system of claim 6, wherein the circuit is one of a plurality of circuits on the microfabricated chip, each of the plurality of circuits comprising a capacitor having a nominal capacitance and an input/output relationship based on the nominal capacitance.

13. The system of claim 12, wherein the processor is configured to individually calibrate each of the plurality of circuits.

* * * * *